United States Patent

Ikeda

(10) Patent No.: US 10,348,085 B2
(45) Date of Patent: Jul. 9, 2019

(54) STATIC ELECTRICITY PROTECTION CIRCUIT, SEMICONDUCTOR INTEGRATED CIRCUIT DEVICE, AND ELECTRONIC APPARATUS

(71) Applicant: SEIKO EPSON CORPORATION, Tokyo (JP)

(72) Inventor: Masuhide Ikeda, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 289 days.

(21) Appl. No.: 15/243,791

(22) Filed: Aug. 22, 2016

(65) Prior Publication Data

US 2017/0063080 A1     Mar. 2, 2017

(30) Foreign Application Priority Data

Sep. 1, 2015 (JP) .................. 2015-171729

(51) Int. Cl.
*H02H 9/04* (2006.01)
*H01L 27/02* (2006.01)

(52) U.S. Cl.
CPC .......... *H02H 9/046* (2013.01); *H01L 27/0255* (2013.01); *H01L 27/0262* (2013.01); *H01L 27/0266* (2013.01); *H01L 27/0288* (2013.01)

(58) Field of Classification Search
CPC . H02H 9/046; H01L 27/0255; H01L 27/0262; H01L 27/0266; H01L 27/0288
USPC ......................................................... 361/56
See application file for complete search history.

(56) References Cited

U.S. PATENT DOCUMENTS

| 2008/0007882 A1* | 1/2008 | Bernard ................. H02H 9/046 361/56 |
|---|---|---|
| 2010/0157491 A1 | 6/2010 | Hong |
| 2012/0127618 A1 | 5/2012 | Hong |
| 2014/0192445 A1 | 7/2014 | Ikeda |
| 2015/0162745 A1 | 6/2015 | Ikeda |
| 2015/0162746 A1 | 6/2015 | Ikeda |

FOREIGN PATENT DOCUMENTS

| JP | 2009-182119 A | 8/2009 |
|---|---|---|
| JP | 2012-513121 A | 6/2012 |
| JP | 2014-132717 A | 7/2014 |
| JP | 2015-115338 A | 6/2015 |
| JP | 2015-115339 A | 6/2015 |

* cited by examiner

Primary Examiner — Zeev V Kitov
(74) Attorney, Agent, or Firm — Oliff PLC

(57) ABSTRACT

This static electricity protection circuit starts a discharge operation only if an applied voltage is greater than or equal to a set voltage, and protects a discharge circuit also when noise or the like is applied during a normal operation. This static electricity protection circuit includes: a resistor R1 and clamp circuit that are connected in series between nodes N1 and N2; a first transistor that turns on in accordance with an increase in a potential difference generated in the resistor R1; a resistor R2 and capacitor C2 that are connected via a node N4 between the nodes N1 and N2; a second transistor that is connected in series with the first transistor between the nodes N1 and N5; a resistor R3 connected between the nodes N5 and N2; a third transistor connected between the nodes N4 and N2; and a discharge circuit connected between the nodes N1 and N2.

20 Claims, 14 Drawing Sheets

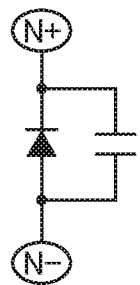
FIG. 20
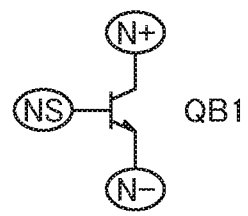
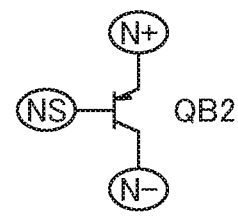
FIG. 21A                    FIG. 21B ial is supplied and a second terminal to which a low-potential-side power source potential is supplied. When a positive charge is applied to the first terminal by electrostatic discharge or the like, the positive charge is discharged to the second terminal via the static electricity protection circuit, and therefore breakdown of the internal circuit can be prevented without an excessively large voltage being applied to the internal circuit.
STATIC ELECTRICITY PROTECTION CIRCUIT, SEMICONDUCTOR INTEGRATED CIRCUIT DEVICE, AND ELECTRONIC APPARATUS

BACKGROUND

1. Technical Field

The present invention relates to a static electricity protection circuit that protects an internal circuit of a semiconductor integrated circuit device from ESD (Electro-Static Discharge). The invention furthermore relates to a semiconductor integrated circuit device in which such a static electricity protection circuit is installed, and an electronic apparatus using such a semiconductor integrated circuit device.

2. Related Art

In a semiconductor integrated circuit device, a static electricity protection circuit is provided in order to prevent breakdown of the internal circuit caused by static electricity charged in a human body, a conveying apparatus, or the like being applied to the internal circuit. For example, the static electricity protection circuit is connected between a first terminal to which a high-potential-side power source potential is supplied and a second terminal to which a low-potential-side power source potential is supplied. When a positive charge is applied to the first terminal by electrostatic discharge or the like, the positive charge is discharged to the second terminal via the static electricity protection circuit, and therefore breakdown of the internal circuit can be prevented without an excessively large voltage being applied to the internal circuit.

As a related technique, FIG. 9 of JP-A-2009-182119 shows a known electrostatic discharge protection circuit that is connected between a high-potential-side first power source line and a low-potential-side second power source line. This electrostatic discharge protection circuit includes a time constant circuit 101 composed of a resistor and a capacitor connected in series between the first power source line and the second power source line, a discharge circuit composed of an N-channel transistor 102 connected between the first power source line and the second power source line, and three-stage inverters 103 to 105, whose input side is connected to the connection node of the resistor and the capacitor, and whose output side is connected to the gate of the transistor 102.

In the electrostatic discharge protection circuit, when a positive charge is applied to the first power source line, if the rising time of the potential of the first power source line is shorter than the time corresponding to the time constant of the time constant circuit 101, the potential at the connection node of the resistor and the capacitor is maintained at a low level. In this period, the gate of the transistor 102 reaches a high level, and the transistor 102 enters the on state. Accordingly, the positive charge applied to the first power source line is discharged to the second power source line, and the internal circuit is protected.

JP-A-2009-182119 is an example of related art (see paragraphs 0003 to 0010, FIG. 9).

However, with the electrostatic discharge protection circuit shown in FIG. 9 of JP-A-2009-182119, current starts to flow to the transistor 102 starting from an operation region in which the voltage between the first power source line and the second power source line is lower than a minimum operation voltage of the internal circuit. Accordingly, if the power source voltage rises sharply when the power source is turned on, there is a risk that the electrostatic discharge protection circuit will start the discharge operation and the internal circuit will malfunction. This kind of electrostatic discharge protection circuit needs to be used with a limit provided on the rising time of the power source voltage at the time of turning on the power source.

Also, during a normal operation in which the power source voltage is supplied between the first power source line and the second power source line, the capacitor is charged via the resistor of the time constant circuit 101, and therefore the input terminal of the inverter 103 is pulled up. Accordingly, there is a risk that even if noise, a discharged charge, or the like is applied from the exterior, the inverter 103 will not operate, the gate of the N-channel transistor 102 will remain at the low level, and therefore the discharge operation will not be performed. As a result, there is a problem in that the N-channel transistor 102 or the internal circuit breaks down.

SUMMARY

In view of this, a first advantage of the invention lies in providing a static electricity protection circuit that can protect a discharge circuit and an internal circuit by starting a discharge operation only in the case where the applied voltage is greater than or equal to a set voltage, and starting the discharge operation when noise, a discharged charge, or the like is applied from the exterior during a normal operation in which a power source voltage is supplied. Also, a second advantage of the invention lies in providing a static electricity protection circuit that can prevent malfunction of an internal circuit even in a case where the discharge operation is started during a normal operation. Furthermore, a third advantage of the invention lies in providing a static electricity protection circuit that can stop a discharge operation after a predetermined amount of time has elapsed since the power source was turned on, even in the case where the discharge operation was started when the power source was turned on. In addition, a fourth advantage of the invention lies in providing a semiconductor integrated circuit device equipped with such a static electricity protection circuit, an electronic apparatus using such a semiconductor integrated circuit device, and the like.

In order to solve at least a portion of the foregoing problems, a static electricity protection circuit according to a first aspect of the invention is a static electricity protection circuit that is connected to a first terminal via a first node and is connected to a second terminal via a second node, including: a first impedance element connected between one of the first and second nodes and a third node; a first clamp circuit connected between the third node and the other of the first and second nodes; a first transistor configured to turn on in accordance with an increase in a potential difference generated between two ends of the first impedance element when the first node reaches a higher potential than the second node; a second impedance element connected between the one of the first and second nodes and a fourth node; a capacitor or second clamp circuit connected between the fourth node and the other of the first and second nodes; a second transistor that is connected in series with the first transistor between the one of the first and second nodes and a fifth node, and is configured to turn on in accordance with an increase in a potential difference generated between two ends of the second impedance element when the first node reaches a higher potential than the second node; a third impedance element connected between the fifth node and the other of the first and second nodes; a third transistor that is connected between the fourth node and the other of the first and second nodes, and is configured to turn on in accordance with an increase in a potential difference generated between two ends of the third impedance element when the first node reaches a higher potential than the second node; and a discharge circuit that is connected between the first node and the second node and is configured to allow current to flow from the first node to the second node in accordance with an increase in a potential difference generated between the two ends of the second or third impedance element when the first node reaches a higher potential than the second node.

Also, a static electricity protection circuit according to a second aspect of the invention is a static electricity protection circuit that is connected to a first terminal via a first node and is connected to a second terminal via a second node, including: a first clamp circuit connected between one of the first and second nodes and a third node; a first impedance element connected between the third node and the other of the first and second nodes; a first transistor configured to turn on in accordance with an increase in a potential difference generated between two ends of the first impedance element when the first node reaches a higher potential than the second node; a second impedance element connected between the one of the first and second nodes and a fourth node; a capacitor or second clamp circuit connected between the fourth node and the other of the first and second nodes; a second transistor that is connected between the one of the first and second nodes and a fifth node, and is configured to turn on in accordance with an increase in a potential difference generated between two ends of the second impedance element when the first node reaches a higher potential than the second node; a third impedance element connected between the fifth node and the other of the first and second nodes; a third transistor that is connected in series with the first transistor between the fourth node and the other of the first and second nodes, and is configured to turn on in accordance with an increase in a potential difference generated between two ends of the third impedance element when the first node reaches a higher potential than the second node; and a discharge circuit that is connected between the first node and the second node and is configured to allow current to flow from the first node to the second node in accordance with an increase in a potential difference generated between the two ends of the second or third impedance element when the first node reaches a higher potential than the second node.

With the first aspect or second aspect of the invention, a discharge operation is started only in the case where the voltage applied between the first node and the second node is greater than or equal to the clamp voltage of the first clamp circuit or the like. Also, even when noise, a discharged charge, or the like is applied from the exterior during a normal operation in which the power source voltage is supplied, if the voltage between the first node and the second node is greater than or equal to the clamp voltage of the first clamp circuit and the like, the discharge operation can be started and the discharge circuit and the internal circuit can be protected.

Here, the static electricity protection circuit may further include a fourth impedance element connected between the fifth node and the sixth node, and the third impedance element may be connected between the sixth node and the other of the first and second nodes. The third and fourth impedance elements constitute a voltage division circuit, and when the discharge operation is started, the voltage between the first node and the second node is held at a predetermined voltage determined according to the division ratio of the voltage division circuit. Accordingly, even if the discharge operation is started during a normal operation, malfunction of the internal circuit can be prevented.

In this case, the static electricity protection circuit may further include a second capacitor connected in parallel with the first clamp circuit. Even if the discharge operation starts when the power source is turned on, upon the elapse of an amount of time corresponding to the time constant of the series circuit constituted by the first impedance element and the second capacitor, the first transistor is mandatorily set to the off state, and the discharge operation performed by the discharge circuit stops. Accordingly, even if the discharge operation is started at the time of turning on the power source, it is possible to stop the discharge operation after the elapse of the predetermined amount of time from when the power source was turned on.

With the above description, it is desirable that a breakdown voltage of the discharge circuit is higher than a clamp voltage of the first clamp circuit and higher than a clamp voltage of the second clamp circuit. Accordingly, the clamp operation starts and the discharge circuit starts the discharge operation before the discharge circuit breaks down, and therefore breakdown of the discharge circuit and the internal circuit can be prevented.

Also, the first and second clamp circuits may include a transistor having an impurity diffusion region of a first conductivity type, and the discharge circuit may include a transistor having an impurity diffusion region of a second conductivity type. Depending on the semiconductor manufacturing process, there are cases where the breakdown voltage of a transistor having an impurity diffusion region of a second conductivity type can be made greater than the breakdown voltage of a transistor having an impurity diffusion region of a first conductivity type. In such a case, the transistors of the first and second clamp circuits break down and the discharge circuit starts the discharge operation before the transistor of the discharge circuit breaks down, and therefore it is possible to prevent breakdown of the discharge circuit and the internal circuit.

Furthermore, the discharge circuit may include a transistor and a thyristor connected in series. Accordingly, even in the case where noise, a discharged charge, or the like is applied from the exterior during a normal operation in which the power source voltage is supplied, the transistor of the discharge circuit does not start a snapback operation, and therefore it is possible to avoid breakdown of the transistor of the discharge circuit.

Alternatively, the discharge circuit may include a plurality of transistors connected in series, and the discharge circuit may include a transistor and a diode connected in series. By connecting a plurality of transistors in cascade in the discharge circuit or connecting a diode to a transistor in series in the discharge circuit, it is possible to increase the snapback start voltage and the hold voltage. Accordingly, the likelihood that the transistor of the discharge circuit will break down is reduced.

A static electricity protection circuit according to a third aspect of the invention is a static electricity protection circuit that is connected to a first terminal via a first node and is connected to a second terminal via a second node, including: a discharge circuit connected between the first node and the second node; a latch circuit configured to latch and output a signal for causing the discharge circuit to operate when static electricity is applied to the first or second terminal; a switch circuit configured to control the latch circuit; and a control circuit configured to cause the latch circuit to operate by turning on the switch circuit in a case where a voltage applied between the first node and the second node is greater than or equal to a predetermined voltage.

The static electricity protection circuit according to the third aspect of the invention is provided with a latch circuit that causes the discharge operation to start when static electricity is applied to the first or second terminal, and a control circuit that turns on the switch circuit in the case where the voltage applied between the first node and the second node is greater than or equal to a predetermined voltage. Accordingly, the discharge operation is started only in the case where the voltage applied between the first node and the second node is greater than or equal to the predetermined voltage. Also, even when noise, a discharged charge, or the like is applied from the exterior during a normal operation in which the power source voltage is supplied, if the voltage between the first node and the second node is greater than or equal to the predetermined voltage, the discharge operation can be started and the discharge circuit and the internal circuit can be protected.

A semiconductor integrated circuit device according to an aspect of the invention includes one above-described static electricity protection circuit. Accordingly, it is possible to prevent breakdown or malfunctioning of the semiconductor integrated circuit device caused by electrostatic discharge, or the like.

An electronic apparatus according to an aspect of the invention includes one above-described semiconductor integrated circuit device. Accordingly, by using a semiconductor integrated circuit device that can start the discharge operation and protect the discharge circuit and internal circuit even when noise, a discharged charge, or the like is applied from the exterior at a normal time of operation during which the power source voltage is supplied, it is possible to provide an electronic apparatus that is not likely to break and is highly reliable.

BRIEF DESCRIPTION OF THE DRAWINGS

The invention will be described with reference to the accompanying drawings, wherein like numbers reference like elements.

FIG. 20 is a diagram showing an exemplary clamp circuit that can be used in the embodiments of the invention.

FIGS. 21A and 21B are diagrams showing exemplary three-terminal elements that can be used in the embodiments of the invention.

DESCRIPTION OF EXEMPLARY EMBODIMENTS

Hereinafter, embodiments of the invention will be described in detail with respect to the drawings. Note that identical constituent elements are denoted by identical reference signs, and redundant description is not included.

Figure 1:
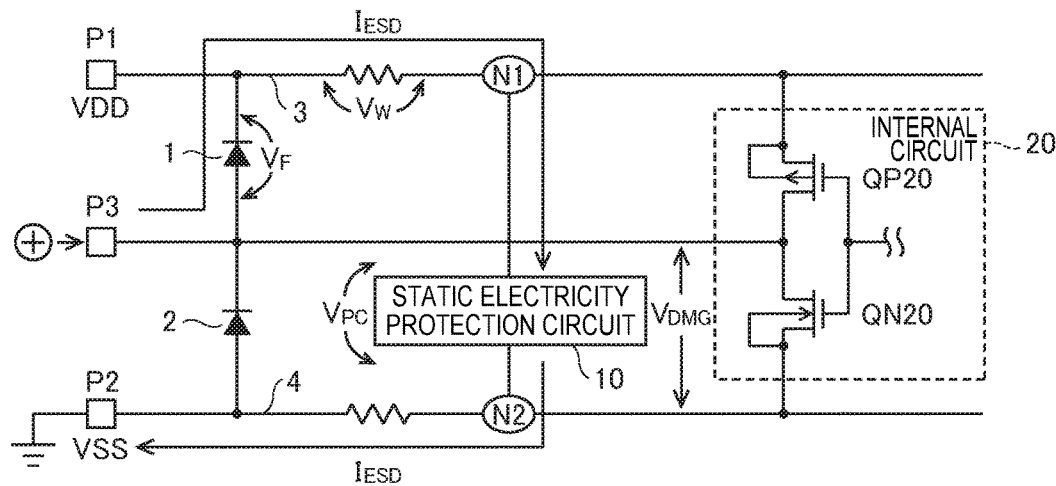
FIG. 1 is a circuit diagram showing an exemplary configuration of a semiconductor integrated circuit device according to an embodiment of the invention.
Figure 2:
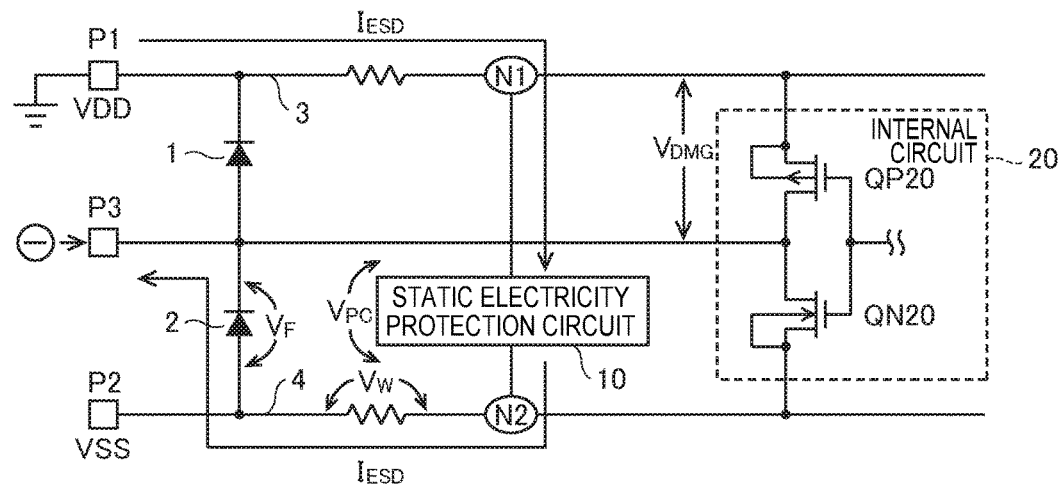
FIG. 2 is a circuit diagram showing an exemplary configuration of a semiconductor integrated circuit device according to an embodiment of the invention.

FIGS. 1 and 2 are circuit diagrams showing exemplary configurations of a semiconductor integrated circuit device according to an embodiment of the invention. The semiconductor integrated circuit device includes power source terminals P1 and P2, a signal terminal P3, diodes 1 and 2, power source wires 3 and 4, a static electricity protection circuit 10 according to an embodiment of the invention, and an internal circuit 20. The power source wires 3 and 4 each have a resistance component. Also, the internal circuit 20 includes a P-channel MOS transistor QP20 and an N-channel MOS transistor QN20.

For example, the static electricity protection circuit 10 may be connected between the power source terminal P1 to which a high-potential-side power source potential VDD is supplied, and the power source terminal P2 to which a low-potential-side power source potential VSS is supplied. Also, the static electricity protection circuit 10 may be connected between the power source terminal P1 and the signal terminal P3, or may be connected between the signal terminal P3 and the power source terminal P2. In the embodiments below, a case will be described in which, as shown in FIGS. 1 and 2 for example, the static electricity protection circuit 10 is connected to the power source terminal P1 via the node N1, and is connected to the power source terminal P2 via the node N2.

When a positive charge is applied to the power source terminal P2 by electrostatic discharge or the like, the positive charge is discharged to the signal terminal P3 via the diode 2, or is discharged to the power source terminal P1 via the diodes 2 and 1, and therefore breakdown of the internal circuit 20 can be prevented without an excessively large voltage being applied to the internal circuit 20. Accordingly, the case in which a reverse voltage is applied to at least one of the diodes 1 and 2 is problematic.

FIG. 1 shows a discharge route in a case where a positive charge is applied to the signal terminal P3 by electrostatic discharge or the like, while the power source terminal P2 is grounded. A surge current $I_{ESD}$ flows in the route constituted by the diode 1, the power source wire 3, the static electricity protection circuit 10, and the power source wire 4 due to electrostatic discharge or the like.

In the discharge operation, if the voltage between the drain and source of the transistor QN20 connected in parallel with the diode 2 to which the reverse voltage is applied is smaller than the breakdown voltage $V_{DMG}$ at which the transistor QN20 breaks down, the static electricity protection circuit 10 can protect the internal circuit 20. For this purpose, it is necessary to satisfy the following equation (1).

$$V_F + V_W + V_{PC} < V_{DMG} \quad (1)$$

Here, $V_F$ is the forward voltage of the diode 1, $V_W$ is the voltage that is generated when a surge current $I_{ESD}$ flows in the resistance component of the power source wire 3, and $V_{PC}$ is the voltage that is generated when the surge current $I_{ESD}$ flows in the static electricity protection circuit 10.

Also, FIG. 2 shows a discharge route in a case where a negative charge is applied to the signal terminal P3 by electrostatic discharge or the like, while the power source terminal P1 is grounded. A surge current $I_{ESD}$ flows in the route constituted by the power source wire 3, the static electricity protection circuit 10, the power source wire 4, and the diode 2 due to electrostatic discharge or the like.

In the discharge operation, if the voltage between the drain and source of the transistor QP20 connected in parallel with the diode 1 to which the reverse voltage is applied is smaller than the breakdown voltage $V_{DMG}$ at which the transistor QP20 breaks down, the static electricity protection circuit 10 can protect the internal circuit 20. For this purpose, it is necessary to satisfy the following equation (2).

$$V_F + V_W + V_{PC} < V_{DMG} \quad (2)$$

Here, $V_F$ is the forward direction voltage of the diode 2, $V_W$ is the voltage that is generated when a surge current $I_{ESD}$ flows in the resistance component of the power source wire 4, and $V_{PC}$ is the voltage that is generated when the surge current $I_{ESD}$ flows in the static electricity protection circuit 10.

As can be understood based on equation (1) and equation (2), in the case shown in FIG. 1 and the case shown in FIG. 2, the condition for protecting the internal circuit 20 can be expressed with the same equations. That is, a condition for protecting the internal circuit 20 is that the sum of the voltages generated in the devices on the discharge route is smaller than the breakdown voltage $V_{DMG}$ at which the elements of the internal circuit 20 break down. By providing such a static electricity protection circuit 10, it is possible to prevent breakdown of the internal circuit 20 caused by electrostatic discharge or the like in various types of semiconductor integrated circuit devices.

First Embodiment

Figure 3:
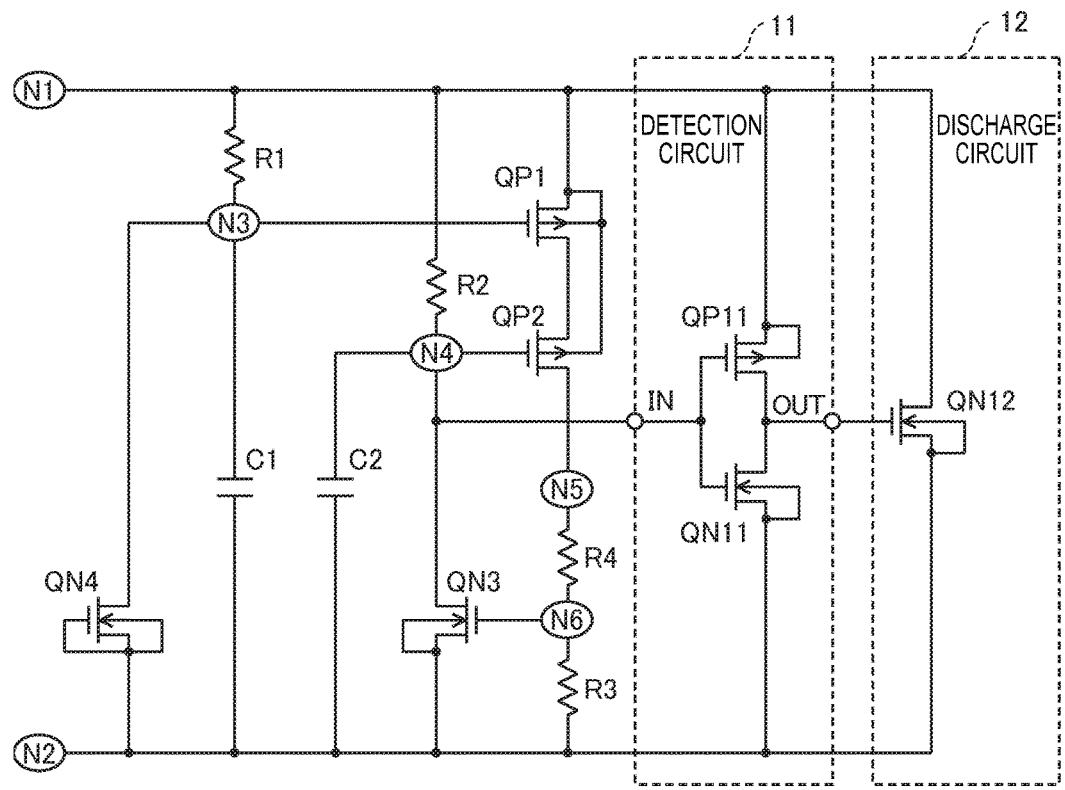
FIG. 3 is a circuit diagram showing an exemplary configuration of a static electricity protection circuit according to a first embodiment of the invention.

FIG. 3 is a circuit diagram showing an exemplary configuration of a static electricity protection circuit according to a first embodiment of the invention. As shown in FIG. 3, the static electricity protection circuit includes resistance elements R1 to R4 serving as first to fourth impedance elements, capacitors C1 and C2, P-channel MOS transistors QP1 and QP2, N-channel MOS transistors QN3 and QN4, a detection circuit 11, and a discharge circuit 12.

The capacitors C1 and C2 may be configured using multiple electrodes formed in multiple wire layers, or may be configured using at least one MOS transistor. For example, the capacitor C1 or C2 can be configured by using the drain, source, and backgate of an N-channel MOS transistor as a first electrode and using the gate as a second electrode.

The resistance element R1 is connected between the node N1 and the node N3 and the transistor QN4 is connected between the node N3 and the node N2. The transistor QN4 has a drain connected to the node N3, and a source and gate connected to the node N2, and functions as a clamp circuit. The capacitor C1 is connected between the node N3 and the node N2, in parallel with the transistor QN4. Also, the resistance element R2 is connected between the node N1 and the node N4 and the capacitor C2 is connected between the node N4 and the node N2.

The transistors QP1 and QP2 are connected in series between the node N1 and the node N5. The transistor QP1 has a source connected to the node N1 and a gate connected to the node N3. The transistor QP2 has a source connected to the drain of the transistor QP1, a drain connected to the node N5, and a gate connected to the node N4. Note that the position of the transistor QP1 and the position of the transistor QP2 may be switched.

The resistance elements R4 and R3 are connected in series between the node N5 and the node N2. The resistance elements R4 and R3 form a voltage division circuit that divides the voltage between the node N5 and the node N2. The transistor QN3 is connected between the node N4 and the node N2. The transistor QN3 has a drain connected to the node N4, a source connected to the node N2, and a gate connected to a node N6, which is the point of connection between the resistance element R4 and the resistance element R3.

When the node N1 reaches a higher potential than the node N2, the transistor QP1 enters the on state in accordance with an increase in the potential difference that is generated between the two ends of the resistance element R1, and the transistor QP2 enters the on state in accordance with an increase in the potential difference generated between the two ends of the resistance element R2.

When the transistors QP1 and QP2 are turned on, the current that flows in the resistance elements R4 and R3 increases, and the voltage divided by the voltage division circuit constituted by the resistance elements R4 and R3 is applied to the gate of the transistor QN3. Accordingly, when the node N1 reaches a higher potential than the node N2, the transistor QN3 enters the on state in accordance with an increase in the potential difference generated between the two ends of the resistance element R3.

When the node N1 reaches a higher potential than the node N2, the detection circuit 11 activates the output signal to the high level in accordance with an increase in the potential difference generated between the two ends of the resistance element R2. For example, the detection circuit 11 includes an inverter constituted by a P-channel MOS transistor QP11 and an N-channel MOS transistor QN11.

The transistor QP11 has a source connected to the node N1, a drain connected to an output terminal OUT, and a gate connected to an input terminal IN. Also, the transistor QN11 has a drain connected to the output terminal OUT, a source connected to the node N2, and a gate connected to the input terminal IN.

The detection circuit 11 detects whether the potential of the node N4 supplied to the input terminal IN is at the high level or the low level, inverts the level, and outputs an output signal having the inverted level from the output terminal OUT. Accordingly, the detection circuit 11 activates the output signal to the high level when the potential difference generated between the two ends of the resistance element R2 is greater than the voltage between the node N1 and the node N2 by a predetermined percentage (e.g., 50%). Note that the detection circuit 11 may include multiple inverters connected in series. Also, other than inverters, it is possible to use converters or the like as the detection circuit 11.

The discharge circuit 12 is connected between the node N1 and the node N2, and if the output voltage of the detection circuit 11 rises in accordance with an increase in the potential difference generated between the two ends of the resistance element R2 when the node N1 reaches a higher potential than the node N2, the discharge circuit 12 allows current to flow from the node N1 to the node N2. For example, the discharge circuit 12 includes an N-channel MOS transistor QN12. The transistor QN12 has a drain connected to the node N1, a source connected to the node N2, and a gate connected to the output terminal OUT of the detection circuit 11. If the voltage between the gate and source becomes greater than or equal to a threshold voltage, the transistor QN12 enters the on state and allows current to flow from the node N1 to the node N2.

In FIG. 3, the detection circuit 11 may be omitted. In this case, for example, the gate of the transistor QN12 of the discharge circuit 12 is connected to the node N6. When the node N1 reaches a higher potential than the node N2, the discharge circuit 12 allows current to flow from the node N1 to the node N2 in accordance with an increase in the potential difference generated between the two ends of the resistance element R3.

In the present embodiment, a first series circuit constituted by the resistance element R1 and the capacitor C1 and a second series circuit constituted by the resistance element R2 and the capacitor C2 are provided. Accordingly, the time constant that determines the condition for starting the discharge operation and the time constant that determines the condition for stopping the discharge operation can be set individually, whereby the discharge operation is started only if the rising of the voltage applied between the node N1 and the node N2 is sharp, and the discharge operation is stopped after the elapse of a predetermined amount of time from the rising of the applied voltage.

In the description hereinafter, the time constant of the first series circuit is assumed to be greater than the time constant of the second series circuit. Accordingly, the time for which the transistor QP1 is kept in the on state can be increased, and the charge applied by electrostatic discharge or the like can be discharged appropriately. Also, the transistor QP2 enters the on state only if the rising of the applied voltage is sharp, whereby malfunctioning of the static electricity protection circuit when the power source voltage rises at the time of turning on the power source can be prevented.

Furthermore, the time constant of the first series circuit may be 200 ns or more, and the time constant of the second series circuit may be 50 ns or less. In a human body model, the surge current indicates a large current value in the time from generation to about 200 ns, and therefore by setting the amount of time from when the discharge operation starts to when the discharge operation stops to 200 ns or more, it is possible to prevent breakdown of the internal circuit caused by static electricity charged in a human body being applied to the internal circuit of the semiconductor integrated circuit device. For example, if the resistance of the resistance element R1 is set to 200 kΩ and the capacitance of the capacitor C1 is set to 1 pF, the time constant of the first series circuit is 200 ns.

Also, in the human body model, the rising time of the surge current is about 10 ns, and therefore if the discharge operation is performed in the case where the rising time of the applied voltage is 50 ns or less, it is possible to prevent malfunction of the static electricity protection circuit in the case where the rising time of the power source voltage is longer than 50 ns during a normal operation. For example, if the resistance of the resistance element R1 is set to 50 kΩ and the capacitance of the capacitor C1 is set to 1 pF, the time constant of the first series circuit is 50 ns.

Here, operations performed by the static electricity protection circuit shown in FIG. 3 will be described in detail.

When a positive voltage (potential of node N1>potential of node N2) is applied between the node N1 and the node N2, current flows from the node N1 to the node N2 via the first series circuit. Accordingly, the potential difference generated between the two ends of the resistance element R1 increases, and the capacitor C1 is charged. The potential of the node N3 rises with respect to the potential of the node N2, in accordance with the time constant of the resistance element R1 and the capacitor C1.

Also, current flows from the node N1 to the node N2 via the second series circuit. Accordingly, the potential difference generated between the two ends of the resistance element R2 increases, and the capacitor C2 is charged. The potential of the node N4 rises with respect to the potential of the node N2, in accordance with the time constant of the resistance element R2 and the capacitor C2. Because the time constant of the second series circuit is smaller than the time constant of the first series circuit, the rising speed of the potential of the node N4 is faster than the rising speed of the potential of the node N3.

During a normal operation, if the voltage applied between the node N1 and the node N2 rises slowly, the potential difference generated between the two ends of the resistance element R2 remains smaller than the threshold voltage of the transistor QP2, and the transistor QP2 remains in the off state. On the other hand, if the voltage applied between the node N1 and the node N2 rises sharply due to electrostatic discharge or the like, first, the potential difference generated between the two ends of the resistance element R1 becomes greater than or equal to the threshold voltage of the transistor QP1, and the transistor QP1 enters the on state. Next, the potential difference generated between the two ends of the resistance element R2 becomes greater than or equal to the threshold voltage of the transistor QP2, and the transistor QP2 enters the on state. Note that at this time, the potential of the input terminal IN of the detection circuit 11 is at the high level.

Due to the transistors QP1 and QP2 entering the on state, the voltage is applied to the voltage division circuit constituted by the resistance elements R4 and R3, and the potential difference generated between the two ends of the resistance element R3 rises from 0 V. Here, if the voltage between the node N1 and the node N2 is smaller than a predetermined voltage, the potential difference generated between the two ends of the resistance element R3 will remain smaller than the threshold voltage of the transistor QN3, and the transistor QN3 will remain in the off state. On the other hand, if the voltage between the node N1 and the node N2 is greater than or equal to a predetermined voltage, the potential difference generated between the two ends of the resistance element R3 becomes greater than or equal to the threshold voltage of the transistor QN3, and the transistor QN3 transitions to the on state.

Due to the transistor QN3 entering the on state, the current that flows in the resistance element R2 increases, and the potential difference generated between the two ends of the resistance element R2 further increases, and therefore the current that flows in the transistor QP2 increases. Due to the current that flows in the transistor QP2 increasing, the current that flows in the resistance elements R4 and R3 increases and the potential difference generated between the two ends of the resistance element R3 further increases, and therefore the current that flows in the transistor QN3 increases (positive feedback).

Accordingly, once the transistors QP2 and QN3 enter the on state, the transistors QP2 and QN3 remain in the on state while the potential of the node N1 is higher than the potential of the node N2, regardless of the time constant of the second series circuit constituted by the resistance element R2 and the capacitor C2.

Also, when the output voltage of the detection circuit 11 rises in accordance with an increase in the potential difference generated between the two ends of the resistance element R2, the transistor QN12 of the discharge circuit 12 starts to allow current to flow from the node N1 to the node N2. When the current continues to flow to the transistor QN12, the charge accumulated in the semiconductor integrated circuit device is discharged, and the voltage between the node N1 and the node N2 falls below a predetermined voltage.

Accordingly, the potential difference generated between the two ends of the resistance element R3 falls below the threshold voltage of the transistor QN3, and therefore the transistor QN3 transitions from the on state to the off state. As a result, the current that flows in the resistance element R2 decreases, and therefore the output voltage of the detection circuit 11 drops, and the transistor QN12 of the discharge circuit 12 transitions from the on state to the off state.

In this way, when the discharge operation is started, the voltage between the node N1 and the node N2 is held at a predetermined voltage determined by the division ratio of the voltage division circuit. Accordingly, even if the discharge operation is started during a normal operation, malfunctioning of the internal circuit can be prevented.

In the present specification, the predetermined voltage held between the two ends of the static electricity protection circuit is referred to as a "hold voltage". The hold voltage $V_H$ is the voltage between the node N1 and the node N2 when the transistor QN3 transitions from the on state to the off state, and is approximated using the following equation (3).

$$V_H \approx Vth_{QN3} \times (R3+R4)/R3 \quad (3)$$

Here, $Vth_{QN3}$ is the threshold voltage of the transistor QN3, R3 is the resistance of the resistance element R3, and R4 is the resistance of the resistance element R4. Note that the resistances R3 and R4 are assumed to be sufficiently greater than the on resistances of the transistors QP1 and QP2. By selecting the resistances of the resistance elements R3 and R4 in accordance with equation (3), it is possible to set a desired hold voltage $V_H$.

Also, upon the elapse of the amount of time corresponding to the time constant of the first series circuit constituted by the resistance element R1 and the capacitor C1, the transistor QP1 is mandatorily set to the off state, and the discharge operation performed by the transistor QN12 of the discharge circuit 12 stops (mandatory off function). Accordingly, even if the discharge operation starts at the time of turning on the power source, it is possible to stop the discharge operation after the elapse of the predetermined amount of time from when the power source is turned on.

However, during a normal operation in which the power source voltage is supplied, the capacitor C1 is charged with a charge via the resistance element R1, and therefore the transistor QP1 is in the off state. Accordingly, there is a risk that even if noise, a discharged charge, or the like is applied from the exterior during a normal operation, the transistor QN3 will not transition to the on state and the discharge operation performed by the discharge circuit 12 will not be performed.

In view of this, in the present embodiment, the transistor QN4 included in the clamp circuit is connected between the node N3 and the node N2. The transistor QN3 also operates as a clamp circuit. When a voltage greater than or equal to the breakdown voltage (clamp voltage) of the transistors QN4 and QN3 is applied between the node N1 and the node N2, the transistor QN4 breaks down and current flows in the resistance element R1, and therefore the transistor QP1 enters the on state in accordance with an increase in the potential difference generated between the two ends of the resistance element R1. Also, since current flows in the resistance element R2 due to the transistor QN3 breaking down, the transistor QP2 enters the on state in accordance with an increase in the potential difference generated between the two ends of the resistance element R2.

Due to the transistors QP1 and QP2 entering the on state, the voltage is applied to the voltage division circuit constituted by the resistance elements R4 and R3, and the potential difference generated between the two ends of the resistance element R3 rises from 0 V. When the potential difference generated between the two ends of the resistance element R3 becomes greater than or equal to the threshold voltage of the transistor QN3, the transistor QN3 transitions to the on state.

Due to the transistor QN3 entering the on state, the current that flows in the resistance element R2 increases, and the potential difference generated between the two ends of the resistance element R2 increases, and therefore the current that flows in the transistor QP2 increases. Due to the current that flows in the transistor QP2 increasing, the current that flows in the resistance elements R4 and R3 increases and the potential difference generated between the two ends of the resistance element R3 further increases, and therefore the current that flows in the transistor QN3 increases (positive feedback).

Also, when the output voltage of the detection circuit 11 rises in accordance with an increase in the potential difference generated between the two ends of the resistance element R2, the transistor QN12 of the discharge circuit 12 starts to allow current to flow from the node N1 to the node N2. When the current continues to flow to the transistor QN12, the charge accumulated in the semiconductor integrated circuit device is discharged, and the voltage between the node N1 and the node N2 drops below a predetermined voltage.

Accordingly, because the potential difference generated between the two ends of the resistance element R3 drops below the threshold voltage of the transistor QN3, the transistor QN3 transitions from the on state to the off state. As a result, the current that flows in the resistance element R2 decreases, and therefore the output voltage of the detection circuit 11 falls and the transistor QN12 of the discharge circuit 12 transitions from the on state to the off state.

Thereafter, when the voltage applied between the node N1 and the node N2 becomes smaller than the breakdown voltage (clamp voltage) of the transistor QN4 or QN3, the transistor QP1 or QP2 enters the off state, and the static electricity protection operation ends.

I-V Characteristic

Figure 4:
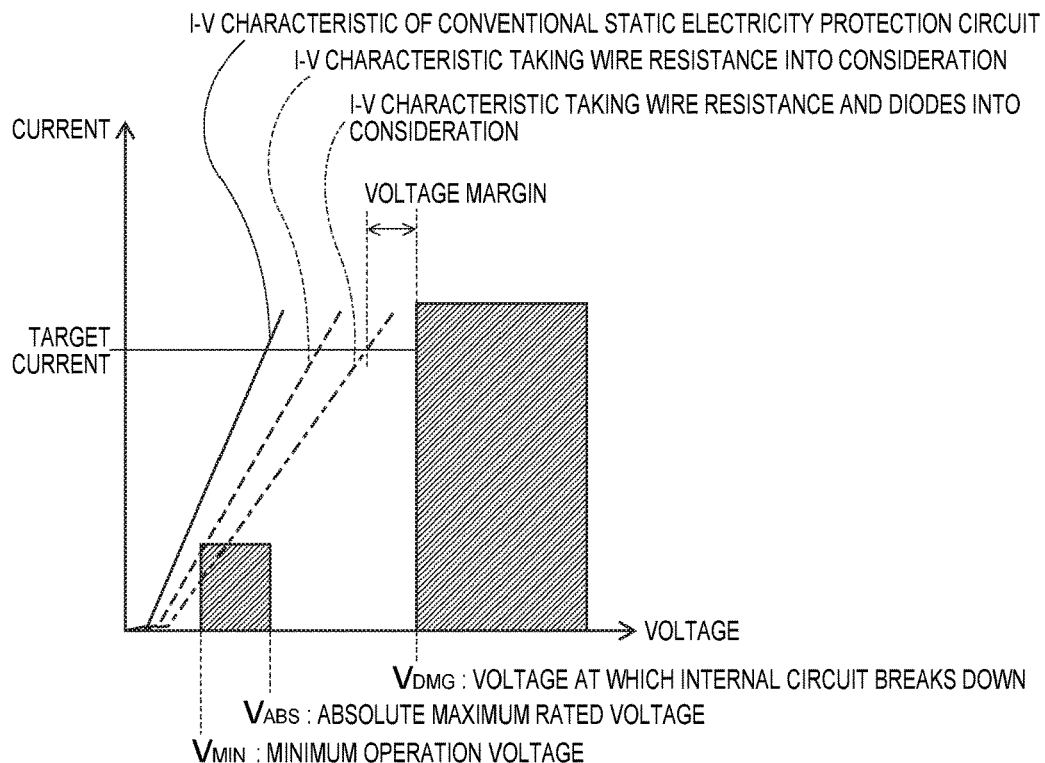
FIG. 4 is a diagram showing an I-V characteristic of a known static electricity protection circuit.
Figure 5:
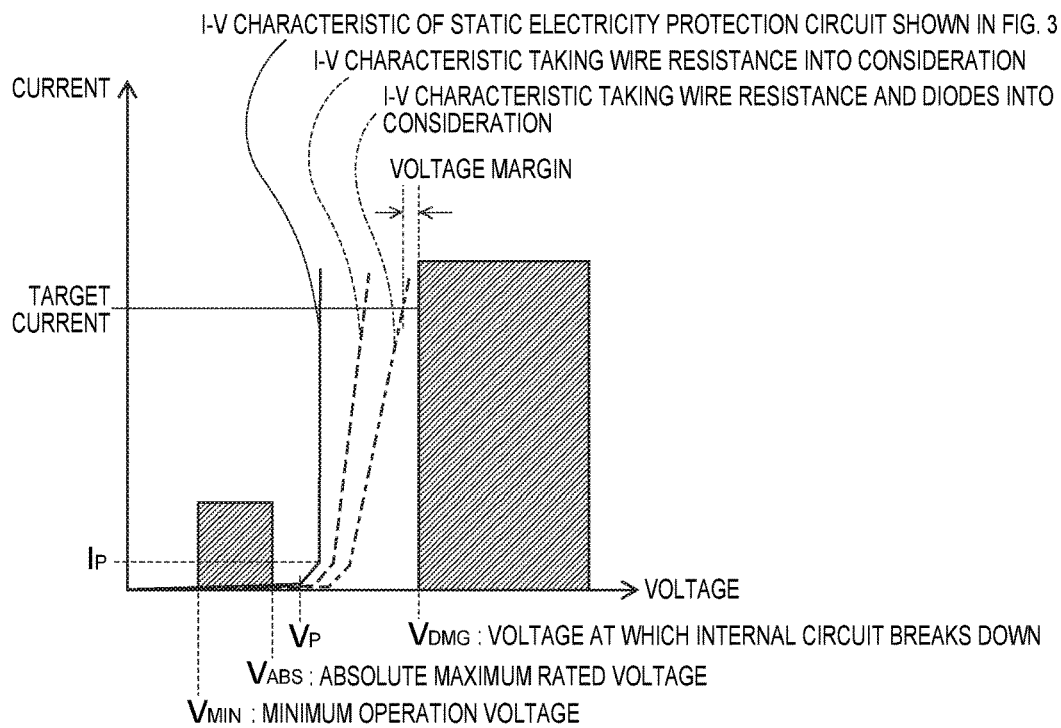
FIG. 5 is a diagram showing an I-V characteristic of the static electricity protection circuit according to the first embodiment.

FIG. 4 is a diagram showing an I-V characteristic in the case of applying a known static electricity protection circuit to the semiconductor integrated circuit device shown in FIG. 1, and FIG. 5 is a diagram showing an I-V characteristic in the case of applying the static electricity protection circuit according to the first embodiment of the invention to the semiconductor integrated circuit device shown in FIG. 1. In FIGS. 4 and 5, the horizontal axis indicates the voltage between the two ends of the static electricity protection circuit on the discharge route, and the vertical axis indicates the current that flows in the discharge route.

Figure 9:
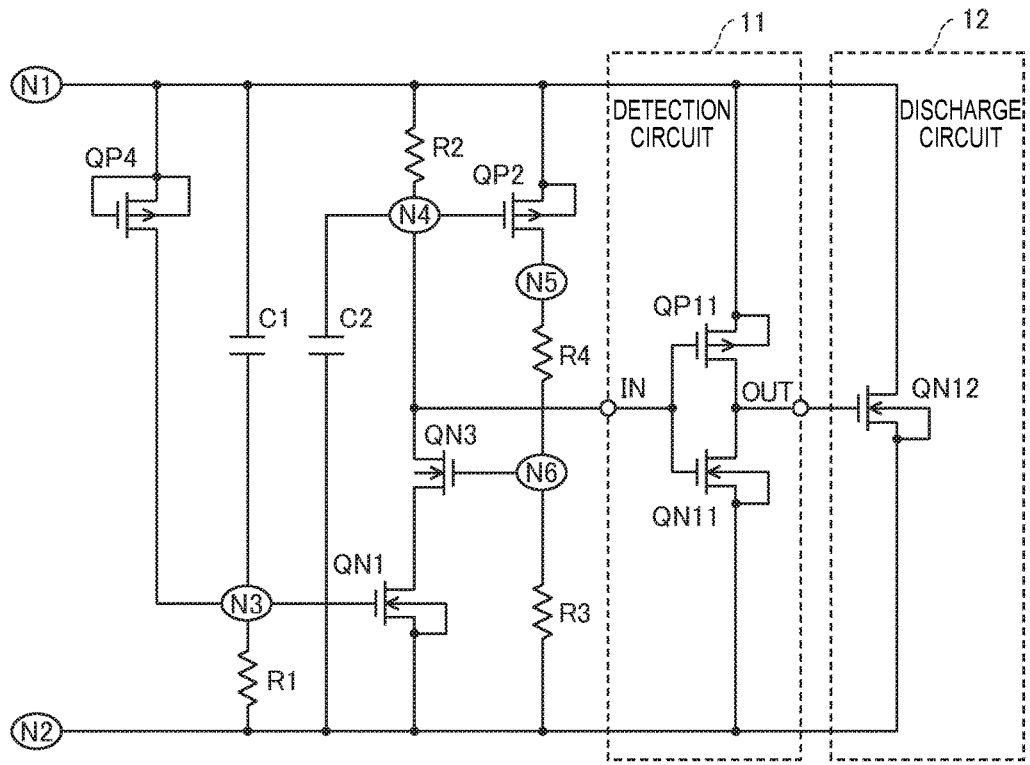
FIG. 9 is a circuit diagram showing an exemplary configuration of a static electricity protection circuit according to a third embodiment of the invention.

No voltage division circuit is provided in the known static electricity protection circuit shown in FIG. 9 of JP-A-2009-182119. In this case, as shown in FIG. 4, the current starts to flow in the discharge route from the operation region in which the voltage between the two ends of the static electricity protection circuit is lower than a minimum operation voltage $V_{MIN}$ of the internal circuit 20. With this, even during a normal operation, there is a risk that current will flow due to the static electricity protection circuit starting the discharge operation according to a sharp rising of the power source voltage caused by the power source being turned on, and the internal circuit 20 will malfunction. Accordingly, in the case of using the known static electricity protection circuit, it is necessary to provide a limit on the rising characteristic of the power source voltage at the time of turning on the power source.

As shown in FIG. 5, the static electricity storage circuit according to the first embodiment of the invention does not start the discharge operation in the region in which the voltage between the two ends is the absolute maximum rated voltage $V_{ABS}$ or less, and therefore current flows in the discharge route. On the other hand, if the voltage between the two ends exceeds a predetermined voltage $V_P$, the static electricity protection circuit starts the discharge operation, and current starts to flow in the discharge route. If the current that flows in the discharge route exceeds a predetermined current $I_P$, the static electricity protection circuit keeps the voltage between the two ends at an approximately constant voltage (hold voltage $V_H$). Even if consideration is given to the voltage that is generated in the wiring resistance and the diodes, when the current that flows in the discharge route reaches a target current, there exists a voltage margin between the voltage between the terminals of the semiconductor integrated circuit device and the breakdown voltage $V_{DMG}$ at which the elements of the internal circuit 20 break down.

Incidentally, the difference between the absolute maximum rated voltage $V_{ABS}$ and the breakdown voltage $V_{DMG}$ has been on the decrease in recent years. Also, when consideration is given to manufacturing variations, power source noise, and the like in the semiconductor integrated circuit device, it is sometimes difficult to set the hold voltage $V_H$ to between the absolute maximum rated voltage $V_{ABS}$ and the breakdown voltage $V_{DMG}$. In the present embodiment, in such a case, the hold voltage $V_H$ can be set to be lower than the absolute maximum rated voltage $V_{ABS}$.

For example, it is sufficient that the hold voltage $V_H$ is set to a minimum operation voltage $V_{MIN}$ of the internal circuit 20 or more. When the static electricity protection circuit 10 starts the discharge operation at the time of turning on the power source, the current flows in the discharge route while the voltage between the two ends of the static electricity protection circuit 10 remains at a voltage greater than or equal to the minimum operation voltage $V_{MIN}$. Accordingly, since a power source voltage greater than or equal to the minimum operation voltage $V_{MIN}$ is supplied to the internal circuit 20, no malfunctioning of the internal circuit 20 occurs. Also, upon the elapse of the amount of time corresponding to the time constant of the first series circuit constituted by the resistance element R1 and the capacitor C1, the transistor QP1 is mandatorily set to the off state, and the discharge operation stops.

In FIG. 3, the capacitor C1 or the resistance element R4 may be omitted due to using a clamp circuit having a suitable clamp voltage. In the case of omitting the capacitor C1, the discharge operation is started only when the voltage applied between the node N1 and the node N2 is greater than or equal to the clamp voltage of the clamp circuit. In this case, the mandatory off function performed by the first series circuit constituted by the resistance element R1 and the capacitor C1 is lost, but when the voltage applied between the node N1 and the node N2 becomes smaller than the clamp voltage, the discharge circuit 12 stops the discharge operation. Furthermore, if the resistance element R4 is omitted, short circuiting will occur between the node N5 and the node N6, and the voltage division function performed by the voltage division circuit constituted by the resistance elements R4 and R3 will be lost, but when the clamp circuit ends the clamp operation and the discharge circuit 12 stops the discharge operation, the internal circuit can perform the operation normally.

According to the present embodiment, even when noise, a discharged charge, or the like is applied from the exterior during a normal operation in which the power source voltage is supplied, if the voltage between the node N1 and the node N2 becomes greater than or equal to the clamp voltage of the clamp circuit, the discharge operation can be started and the discharge circuit 12 and the internal circuit can be protected. Accordingly, it is possible to prevent breakdown or malfunctioning of the semiconductor integrated circuit device caused by electrostatic discharge, or the like.

Modified Example of First Embodiment

Figure 6:
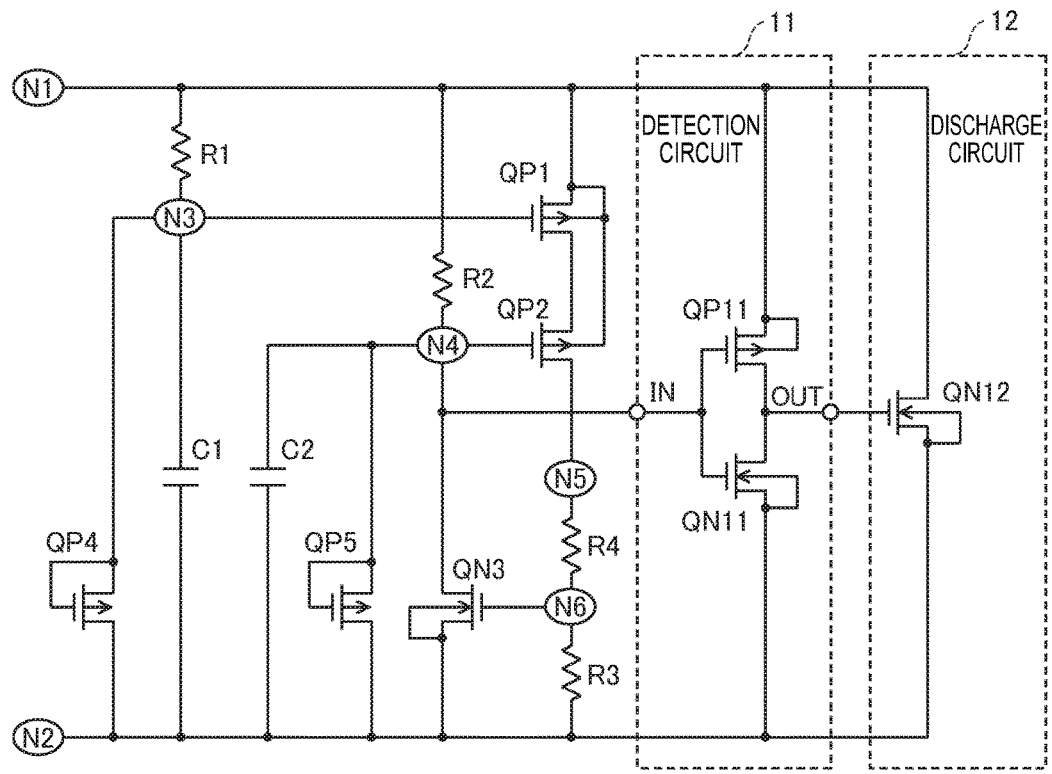
FIG. 6 is a circuit diagram showing an exemplary configuration of a static electricity protection circuit according to a modified example of the first embodiment.

FIG. 6 is a circuit diagram showing an exemplary configuration of a static electricity protection circuit according to a modified example of the first embodiment of the invention. With this static electricity protection circuit, a P-channel MOS transistor QP4 is used as a first clamp circuit instead of the N-channel MOS transistor QN4 shown in FIG. 3, and a P-channel MOS transistor QP5 is added as a second clamp circuit. Note that the capacitor C2 may be omitted. The modified example of the first embodiment may be similar to the first embodiment in other respects.

In general, it is desirable that the breakdown voltage of the discharge circuit 12 is higher than the clamp voltage of the first clamp circuit and higher than the clamp voltage of the second clamp circuit. Accordingly, the clamp operation starts and the discharge circuit 12 starts the discharge operation before the discharge circuit 12 breaks down, and therefore breakdown of the discharge circuit 12 and the internal circuit can be prevented.

Depending on the semiconductor manufacturing process, there are cases where the breakdown voltage of a transistor having an impurity diffusion region of a second conductivity type can be made greater than the breakdown voltage of a transistor having an impurity diffusion region of a first conductivity type. In such a case, it is effective to use a configuration in which the first and second clamp circuits include transistors that have impurity diffusion regions of the first conductivity type and the discharge circuit 12 includes transistors that have impurity diffusion regions of the second conductivity type.

Accordingly, the transistors of the first and second clamp circuits break down and the discharge circuit 12 starts the discharge operation before the transistor of the discharge circuit 12 breaks down, and therefore it is possible to prevent breakdown of the discharge circuit 12 and the internal circuit. Here, the first conductivity type may be the P type and the second conductivity type may be the N type, or the first conductivity type may be the N type and the second conductivity type may be the P type.

The static electricity protection circuit shown in FIG. 6 corresponds to the case in which the breakdown voltage of the N-channel MOS transistor is greater than the breakdown voltage of the P-channel MOS transistor. In this case, the transistor QP4 of the first clamp circuit and the transistor QP5 of the second clamp circuit break down and the transistor QN12 of the discharge circuit 12 starts the discharge operation before the transistor QN12 of the discharge circuit 12 breaks down, and therefore breakdown of the discharge circuit 12 and the internal circuit can be prevented.

Second Embodiment

Figure 7:
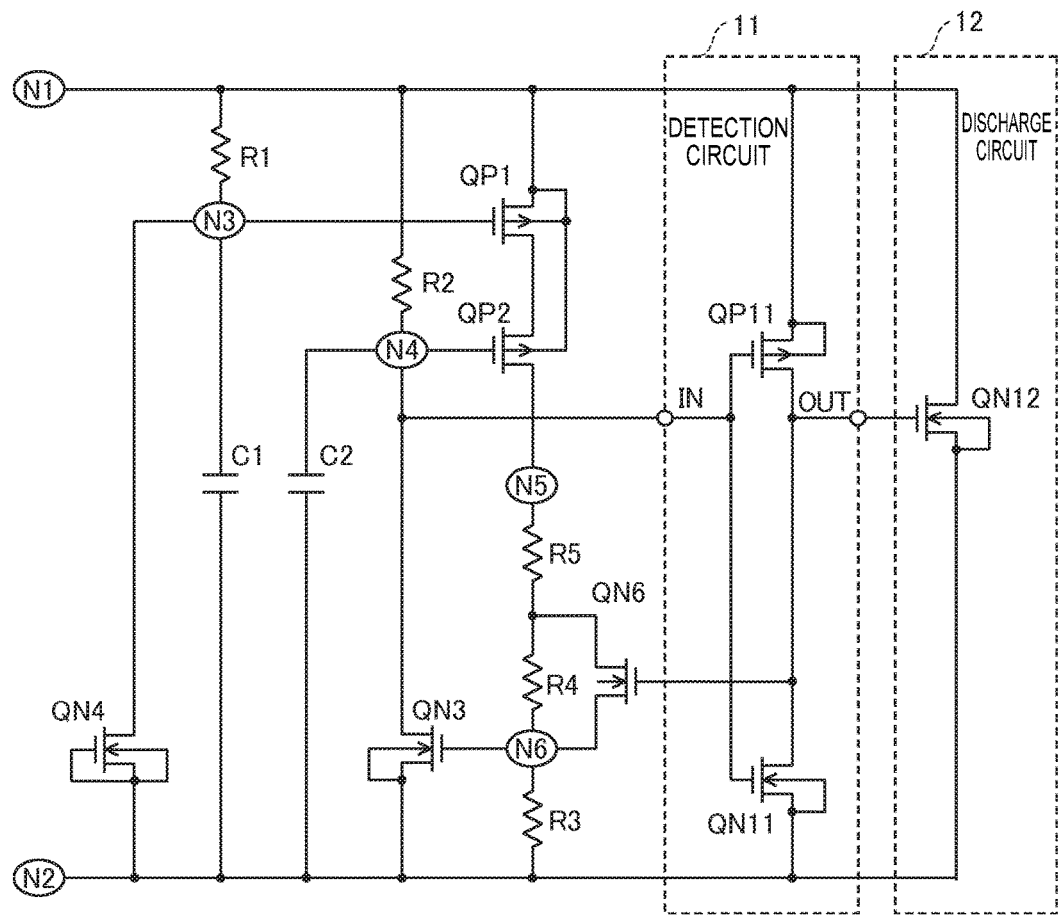
FIG. 7 is a circuit diagram showing an exemplary configuration of a static electricity protection circuit according to a second embodiment of the invention.

FIG. 7 is a circuit diagram showing an exemplary configuration of a static electricity protection circuit according to a second embodiment of the invention. The static electricity protection circuit according to the second embodiment may furthermore include a transistor connected in parallel with the resistance element R4, and may furthermore include an impedance element connected in series with the resistance element R4 in the static electricity protection circuit according to the first embodiment shown in FIG. 3. The second embodiment may be similar to the first embodiment in other respects. FIG. 7 shows an exemplary static electricity protection circuit to which an N-channel MOS transistor QN6 and a resistance element R5 have been added.

The transistor QN6 has a drain connected to one end of the resistance element R4, a source connected to the other end of the resistance element R4, and a gate connected to the output terminal OUT of the detection circuit 11. The transistor QN6 turns on when the output signal of the detection circuit 11 is activated at the high level. Also, the resistor R5 is connected between the node N5 and one end of the resistance element R4.

The transistor QN6 and the resistance element R5 constitute a voltage division circuit together with the resistance elements R4 and R3. Once the static electricity protection circuit starts the discharge operation due to the output signal of the detection circuit 11 being activated at the high level by electrostatic discharge or the like, the on resistance of the transistor QN6 drops, and the division ratio in the voltage division circuit rises. As a result, the voltage between the node N1 and the node N2 drops, the margin with respect to the voltage at which the internal circuit of the semiconductor integrated circuit device breaks down increases, and thereby the electrostatic tolerance is improved.

The hold voltage $V_H$ is the voltage between the node N1 and the node N2 when the transistor QN3 transitions from the on state to the off state, and is approximated using the following equation (4).

$$V_H \approx Vth_{QN3} \times (R3+\alpha R4+R5)/R3 \quad (4)$$

Here, $Vth_{QN3}$ is the threshold voltage of the transistor QN3, $\alpha$ is a coefficient in a range from 0 to 1, R3 is the resistance of the resistance element R3, R4 is the resistance of the resistance element R4, and R5 is the resistance of the resistance element R5. Note that the resistances R3 and R4 are assumed to be sufficiently larger than the on resistances of the transistors QP1 and QP2. Also, if the resistance element R5 is not provided, R5=0.

Here, as the current that flows in the transistor QN12 of the discharge circuit 12 increases, the on resistance of the transistor QN6 decreases, and therefore the value of the coefficient α also decreases. Accordingly, in equation (4), the hold voltage $V_H$ decreases as the current that flows in the transistor QN12 of the discharge circuit 12 increases.

That is, when the current that flows in the transistor QN12 of the discharge circuit 12 is small, a=1 is set, and the hold voltage is approximated using the following equation (5).

$$V_H \approx Vth_{QN3} \times (R3+R4+R5)/R3 \quad (5)$$

On the other hand, when the current that flows in the transistor QN12 of the discharge circuit 12 is large, α=0 is set, and the hold voltage $V_H$ is approximated using the following equation (6).

$$V_H \approx Vth_{QN3} \times (R3+R5)/R3 \quad (6)$$

By setting the resistance values of the resistance elements R3 to R5 in accordance with equation (5) and equation (6), the hold voltage $V_H$ can be changed in a desirable voltage range.

I-V Characteristic

Figure 8:
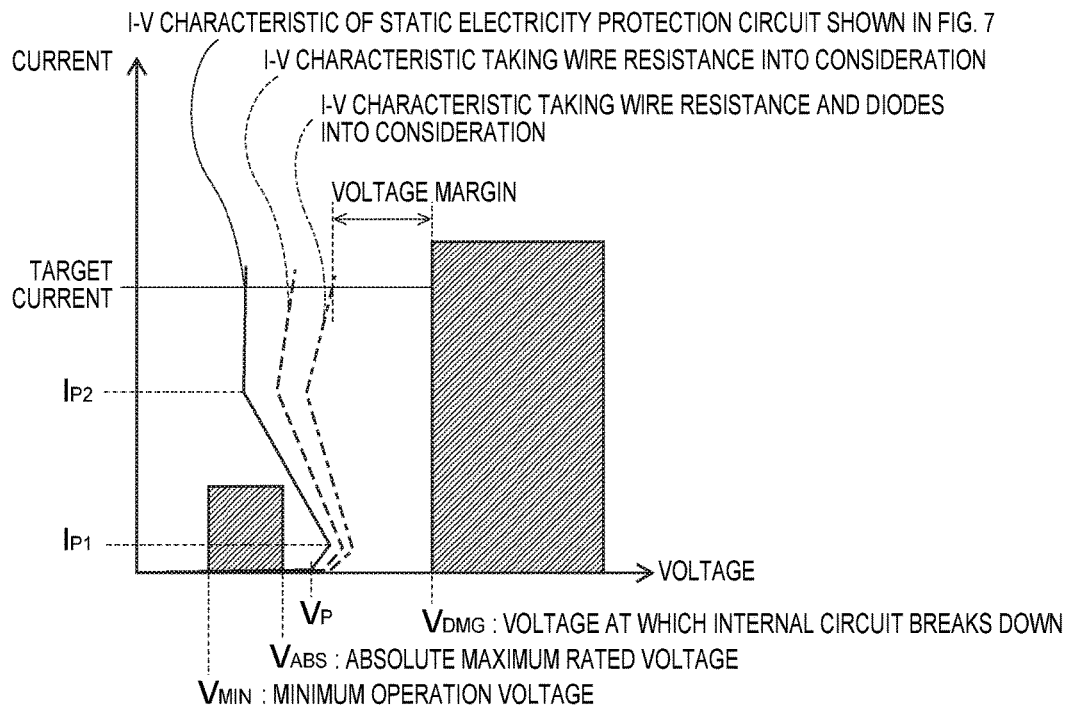
FIG. 8 is a diagram showing an I-V characteristic of the static electricity protection circuit according to the second embodiment.

FIG. 8 is a diagram showing an I-V characteristic in the case of applying the static electricity protection circuit according to the second embodiment to the semiconductor integrated circuit device shown in FIG. 1. In FIG. 8, the horizontal axis indicates the voltage between the two ends of the static electricity protection circuit and the like on the discharge route, and the vertical axis indicates the current that flows in the discharge route.

As shown in FIG. 8, the static electricity protection circuit according to the second embodiment of the invention does not start the discharge operation in the region in which the voltage between the two ends is the absolute maximum rated voltage $V_{ABS}$ or less, and therefore current does not flow in the discharge route. On the other hand, if the voltage between the two ends exceeds a predetermined voltage $V_P$, the static electricity protection circuit starts the discharge operation, and current starts to flow in the discharge route.

In the first operation region, in which the current that flows in the discharge route is between a first predetermined current $I_{P1}$ and a second predetermined current $I_{P2}$, the voltage between the ends of the static electricity protection current drops as the current that flows in the discharge route increases. In the second operation region, in which the current that flows in the discharge route exceeds the second predetermined current $I_{P2}$, the static electricity protection circuit keeps the voltage between the two ends at an approximately constant voltage.

Accordingly, even if consideration is given to the voltage that is generated in the wiring resistance and the diodes, when the current that flows in the discharge route reaches a target current, there exists a voltage margin larger than that of the first embodiment between the voltage between the terminals of the semiconductor integrated circuit device and the breakdown voltage $V_{DMG}$ at which the elements of the internal circuit 20 break down.

According to the present embodiment, once the static electricity protection circuit starts the discharge operation due to electrostatic discharge or the like, the division ratio of the voltage division circuit constituted by the resistance elements R3 to R5 and the transistor QN6 rises, and therefore the voltage between the node N1 and the node N2 drops, as a result of which the margin with respect to the breakdown voltage $V_{DMG}$ at which the internal circuit of the semiconductor integrated circuit device breaks down increases, whereby the electrostatic tolerance improves.

Also, in the present embodiment as well, the hold voltage $V_H$ may be set lower than the absolute maximum rated voltage $V_{ABS}$. For example, it is sufficient that the hold voltage $V_H$ is set to a minimum operation voltage $V_{MIN}$ of the internal circuit 20 or more. When the static electricity protection circuit 10 starts the discharge operation at the time of turning on the power source, the current flows in the discharge route while the voltage between the ends of the static electricity protection circuit 10 remains at a voltage greater than or equal to the minimum operation voltage $V_{MIN}$. Accordingly, since a power source voltage greater than or equal to the minimum operation voltage $V_{MIN}$ is supplied to the internal circuit 20, no malfunctioning of the internal circuit 20 occurs. Also, upon the elapse of the amount of time corresponding to the time constant of the first series circuit constituted by the resistance element R1 and the capacitor C1, the transistor QP1 is mandatorily set to the off state, and the discharge operation stops.

Third Embodiment

FIG. 9 is a circuit diagram showing an exemplary configuration of a static electricity protection circuit according to a third embodiment of the invention. The static electricity protection circuit according to the third embodiment is obtained by replacing one P-channel MOS transistor with an N-channel MOS transistor in the static electricity protection circuit according to the first embodiment shown in FIG. 3, and performs operations similar to those of the static electricity protection circuit according to the first embodiment. The third embodiment may be similar to the first or second embodiment in other respects.

As shown in FIG. 9, the static electricity protection circuit includes the capacitors C1 and C2, the resistance elements R1 to R4, the N-channel MOS transistors QN1 and QN3, the P-channel MOS transistors QP2 and QP4, the detection circuit 11, and the discharge circuit 12.

The transistor QP4 is connected between the node N1 and the node N3. The transistor QP4 has a source and a gate connected to the node N1, and a drain connected to the node N3, and functions as a clamp circuit. The capacitor C1 is connected between the node N1 and the node N3 and the resistance element R1 is connected between the node N3 and the node N2. Also, the resistance element R2 is connected between the node N1 and the node N4 and the capacitor C2 is connected between the node N4 and the node N2.

The transistors QN1 and QN3 are connected in series between the node N4 and the node N2. The transistor QN1 has a source connected to the node N2 and a gate connected to the node N3. The transistor QN3 has a drain connected to the node N4, a source connected to the drain of the transistor QN1, and a gate connected to the node N6. Note that the position of the transistor QN1 and the position of the transistor QN3 may be switched.

The transistor QP2 is connected between the node N1 and the node N5. The transistor QP2 has a source connected to the node N1, a drain connected to the node N5, and a gate connected to the node N4. The resistance elements R4 and R3 are connected in series between the node N5 and the node N2. The resistance elements R4 and R3 form a voltage division circuit that divides the voltage between the node N5 and the node N2.

When the node N1 is at a higher potential than the node N2, the transistor QN1 enters the on state in accordance with an increase in the potential difference generated between the two ends of the resistance element R1, and the transistor QP2 enters the on state in accordance with an increase in the potential difference generated between the two ends of the resistance element R2.

When the transistor QN1 enters the on state, the source of the transistor QN3 is connected to the node N1 via the transistor QN1. Also, when the transistor QP2 enters the on state, the current that flows in the resistance elements R4 and R3 increases, and the voltage divided by the voltage division circuit constituted by the resistance elements R4 and R3 is applied to the gate of the transistor QN3. Accordingly, when the node N1 reaches a higher potential than the node N2, the transistor QN3 enters the on state in accordance with an increase in the potential difference generated between the two ends of the resistance element R3.

In the present embodiment, the transistor QP4 included in the clamp circuit is connected between the node N1 and the node N3. When a voltage greater than or equal to the breakdown voltage of the transistors QP4 and QP2 is applied between the node N1 and the node N2, the transistor QP4 breaks down and current flows in the resistance element R1, and therefore the transistor QN1 enters the on state in accordance with an increase in the potential difference generated between the two ends of the resistance element R1. Also, the transistor QP2 breaks down and current flows in the resistance elements R4 and R3, and therefore the transistor QN3 enters the on state in accordance with an increase in the potential difference generated between the two ends of the resistance element R3.

Due to the transistors QN1 and QN3 entering the on state, the current that flows in the resistance element R2 increases, and the potential difference generated between the two ends of the resistance element R2 increases. When the output voltage of the detection circuit 11 rises in accordance with an increase in the potential difference generated between the two ends of the resistance element R2, the transistor QN12 of the discharge circuit 12 starts to allow current to flow from the node N1 to the node N2. When the current continues to flow to the transistor QN12, the charge accumulated in the semiconductor integrated circuit device is discharged, and the voltage between the node N1 and the node N2 drops below a predetermined voltage.

Accordingly, the potential difference generated between the two ends of the resistance element R3 falls below the threshold voltage of the transistor QN3, and therefore the transistor QN3 transitions from the on state to the off state. As a result, the current that flows in the resistance element R2 decreases, and therefore the output voltage of the detection circuit 11 drops, and the transistor QN12 of the discharge circuit 12 transitions from the on state to the off state. In this way, when the discharge operation is started, the voltage between the node N1 and the node N2 is held at a predetermined voltage (hold voltage) determined by the division ratio of the voltage division circuit. Accordingly, even if the discharge operation is started during a normal operation, malfunctioning of the internal circuit can be prevented.

Thereafter, when the voltage applied between the node N1 and the node N2 becomes smaller than the breakdown voltage of the transistor QP4 or QP2, the transistor QN1 or QN3 enters the off state, and therefore the potential difference generated between the two ends of the resistance element R2 drops. Accordingly, the output voltage of the detection circuit 11 falls, and the discharge operation of the discharge circuit 12 stops.

Fourth Embodiment

As shown in FIG. 3, if an N-channel MOS transistor is used as the discharge element in the discharge circuit 12, there is a risk that breakdown will occur due to the N-channel MOS transistor starting a snapback operation when a positive charge is applied from the exterior to the node N1. That is to say, when the drain voltage is raised while the N-channel MOS transistor is in the off state with the gate and source of the N-channel MOS transistor used as a reference potential, the electric field inside of the air layer on the drain side increases. Accordingly, a pair consisting of a hole and an electron is generated, and the hole moves to the substrate (semiconductor substrate) at the reference potential.

The substrate is biased at a positive voltage due to the movement of the hole, and as a result, a parasitic NPN bipolar transistor constituted by a collector, a base, and an emitter using the drain (N$^+$), substrate (P$^-$), and source (N$^+$) of an N-channel MOS transistor turns on. Accordingly, when the transistors QN4 and QN3 shown in FIG. 3 break down and the current starts to flow, there is a possibility that the transistor QN12 of the discharge circuit 12 will also reach the breakdown voltage and start the snapback operation. In view of this, an embodiment for avoiding a snapback operation will be described below.

Figure 10:
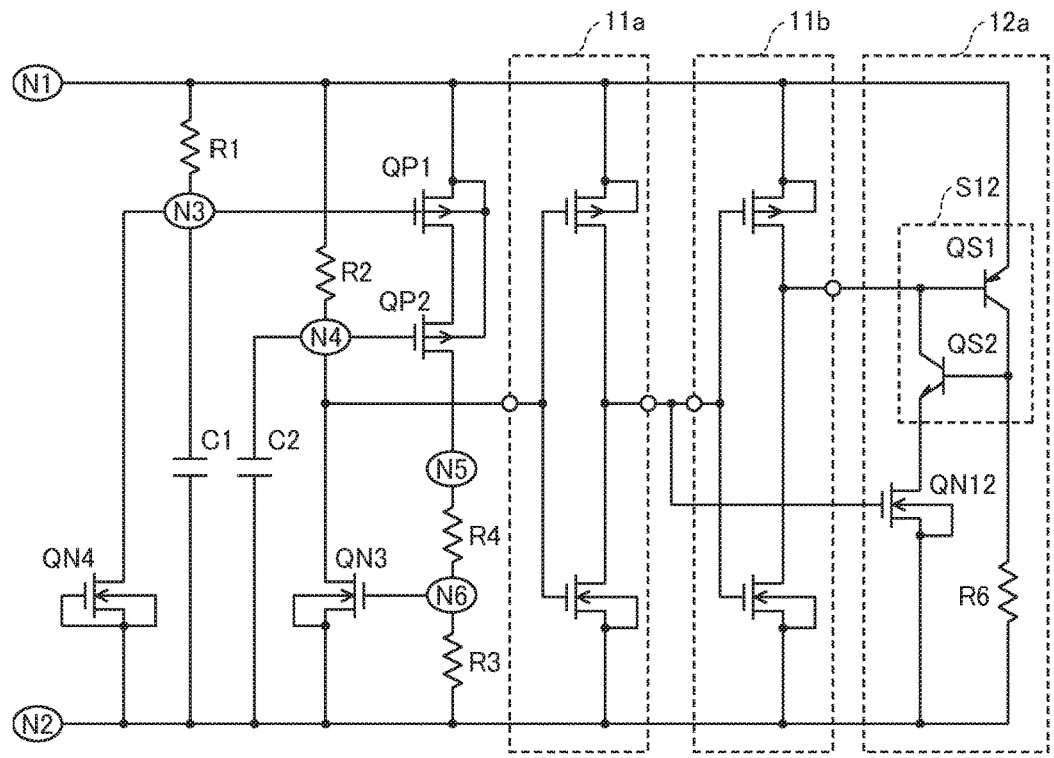
FIG. 10 is a diagram showing an exemplary configuration of a static electricity protection circuit according to a fourth embodiment of the invention.

FIG. 10 is a circuit diagram showing an exemplary configuration of a static electricity protection circuit according to the fourth embodiment of the invention. In the fourth embodiment, a detection circuit 11a and a detection circuit 11b are used instead of the detection circuit 11 in the first embodiment shown in FIG. 3, and a discharge circuit 12a is used instead of the discharge circuit 12. The fourth embodiment may be similar to the first embodiment in other respects.

The respective configurations of the detection circuits 11a and 11b are the same as the configuration of the detection circuit 11 shown in FIG. 3. The detection circuit 11a inverts and outputs the level of the potential of the node N4, and the detection circuit 11b inverts and outputs the level of the output signal of the detection circuit 11a. The discharge circuit 12a includes the transistor QN12 and a thyristor S12, which are connected in series, and a resistance element R6.

The thyristor S12 is constituted by a PNP bipolar transistor QS1 and an NPN bipolar transistor QS2. The emitter of the transistor QS1 corresponds to the anode of the thyristor S12, and the emitter of the transistor QS2 corresponds to the cathode of the thyristor S12.

The emitter of the transistor QS1 is connected to the node N1, the collector is connected to the node N2 via the resistance element R6, and the base is connected to the output terminal of the detection circuit 11b. The collector of the transistor QS2 is connected to the output terminal of the detection circuit 11b, the emitter is connected to the drain of the transistor QN12, and the base is connected to the collector of the transistor QS1. The source of the transistor QN12 is connected to the node N2, and the gate is connected to the output terminal of the detection circuit 11a. Accordingly, when the potential of the node N4 reaches the low level, the transistor QN12 and the thyristor S12 enter the on state.

An operation in the case where noise, a discharged charge, or the like is applied from the exterior during a normal operation in which the power source voltage is supplied will be described below. When a voltage greater than or equal to the breakdown voltage (clamp voltage) of the transistors QN4 and QN3 is applied between the node N1 and the node N2, the transistor QN4 breaks down and current flows in the resistance element R1, and therefore the transistor QP1 enters the on state in accordance with an increase in the potential difference generated between the two ends of the resistance element R1. Also, because current flows in the resistance element R2 due to the transistor QN3 breaking down, the transistor QP2 enters the on state in accordance with an increase in the potential difference generated between the two ends of the resistance element R2.

Due to the transistors QP1 and QP2 entering the on state, the voltage is applied to the voltage division circuit constituted by the resistance elements R4 and R3, and the potential difference generated between the two ends of the resistance element R3 rises from 0 V. When the potential difference generated between the two ends of the resistance element R3 becomes greater than or equal to the threshold voltage of the transistor QN3, the transistor QN3 transitions to the on state.

Due to the transistor QN3 entering the on state, the current that flows in the resistance element R2 increases, and the potential difference generated between the two ends of the resistance element R2 increases, and therefore the current that flows in the transistor QP2 increases. Due to the current that flows in the transistor QP2 increasing, the current that flows in the resistance elements R4 and R3 increases and the potential difference generated between the two ends of the resistance element R3 further increases, and therefore the current that flows in the transistor QN3 increases (positive feedback).

Also, when the output voltage of the detection circuit 11a starts rising in accordance with an increase in the potential difference generated between both ends of the resistance element R2, the gate potential of the transistor QN12 of the discharge circuit 12a also starts increasing. Before and after the gate potential of the transistor QN12 starts rising, the output signal of the detection circuit 11b is at the high level and the thyristor S12 is in the off state, and therefore the drain of the transistor QN12 is in a high-impedance state.

When the voltage between the gate and source of the transistor QN12 becomes greater than or equal to the threshold voltage, the transistor QN12 enters the on state, and furthermore, when the output signal of the detection circuit 11b reaches the low level, the thyristor S12 enters the on state, and current starts to flow from the node N1 to the node N2. When the current continues to flow to the thyristor S12, the charge accumulated in the semiconductor integrated circuit device is discharged, and the voltage between the node N1 and the node N2 falls below a predetermined voltage.

Accordingly, the potential difference generated between the two ends of the resistance element R3 falls below the threshold voltage of the transistor QN3, and therefore the transistor QN3 transitions from the on state to the off state. As a result, the current that flows in the resistance element R2 decreases, and therefore the output voltage of the detection circuit 11a falls, the output voltage of the detection circuit 11b rises, and the transistor QN12 and thyristor S12 of the discharge circuit 12a transition from the on state to the off state. In this way, when the discharge operation is started, the voltage between the node N1 and the node N2 is held at a predetermined voltage (hold voltage) determined by the division rate of the voltage division circuit. Accordingly, even if the discharge operation is started during a normal operation, malfunctioning of the internal circuit can be prevented.

Thereafter, when the voltage applied between the node N1 and the node N2 becomes smaller than the breakdown voltage (clamp voltage) of the transistor QN4 or QN3, the transistor QP1 or QP2 enters the off state, and therefore the potential difference generated between the two ends of the resistance element R3 drops. Accordingly, the transistor QN3 enters the off state, the output voltage of the detection circuit 11a drops, and the transistor QN12 of the discharge circuit 12a enters the off state. As a result, the drain potential of the transistor QN12 rises, and the potential difference between the anode and cathode of the thyristor S12 drops. In addition, because the output voltage of the detection circuit 11b also rises, the thyristor S12 enters the off state, and the discharge operation of the discharge circuit 12a stops.

According to the present embodiment, even in the case where noise, a discharged charge, or the like is applied from the exterior during a normal operation in which the power source voltage is supplied, the transistor QN12 of the discharge circuit 12a does not start a snapback operation, and therefore breakdown of the transistor QN12 of the discharge circuit 12a can be avoided.

Fifth Embodiment

Figure 11:
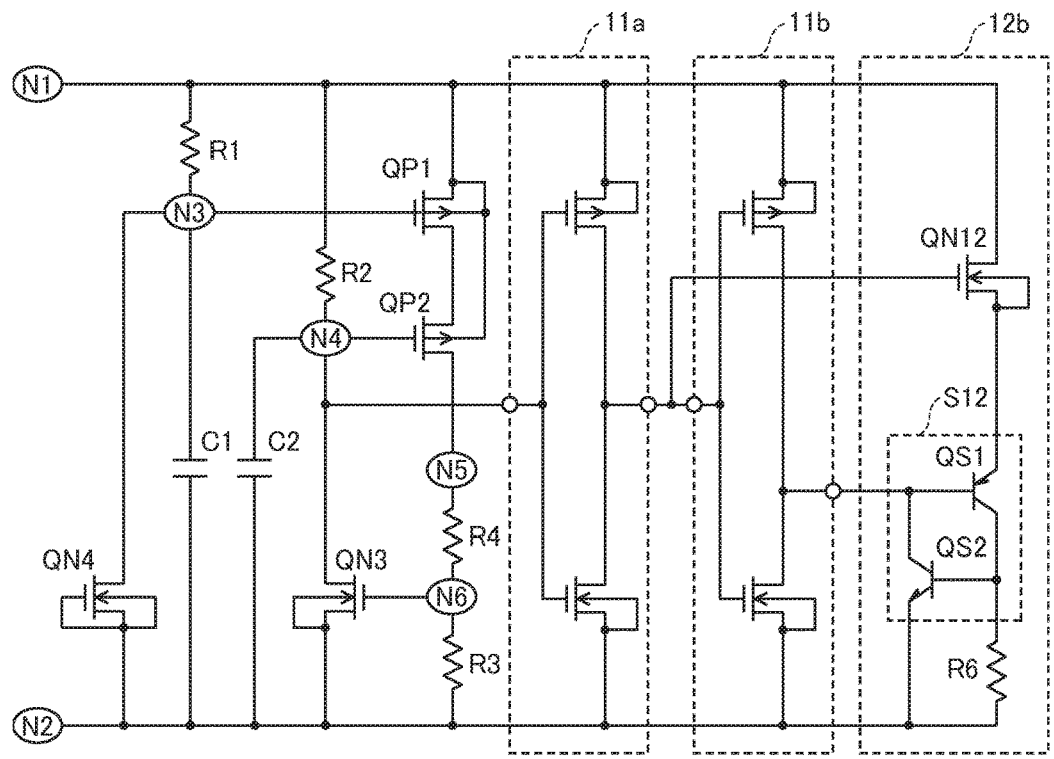
FIG. 11 is a circuit diagram showing an exemplary configuration of a static electricity protection circuit according to a fifth embodiment of the invention.

FIG. 11 is a circuit diagram showing an exemplary configuration of a static electricity protection circuit according to a fifth embodiment of the invention. In the fifth embodiment, the position of the transistor QN12 and the position of the thyristor S12 in the fourth embodiment shown in FIG. 10 have been switched. The fifth embodiment may be similar to the fourth embodiment in other respects.

As shown in FIG. 11, in a discharge circuit 12b, the drain of the transistor QN12 is connected to the node N1 and the gate is connected to the output terminal of the detection circuit 11a. The emitter of the transistor QS1 is connected to the source of the transistor QN12, the collector is connected to the node N2 via the resistance element R6, and the base is connected to the output terminal of the detection circuit 11b. The collector of the transistor QS2 is connected to the output terminal of the detection circuit 11b, the emitter is connected to the node N2, and the base is connected to the collector of the transistor QS1. Accordingly, when the potential of the node N4 reaches the low level, the transistor QN12 and the thyristor S12 enter the on state.

According to the fifth embodiment, the source potential of the transistor QN12 is greater than the potential of the substrate. Accordingly, since the emitter potential of the parasitic NPN bipolar transistor is higher than a base potential, it is less likely that a snapback operation will occur. Accordingly, in comparison with the fourth embodiment, the likelihood that the transistor QN12 will break down is even lower.

Sixth Embodiment

Figure 12:
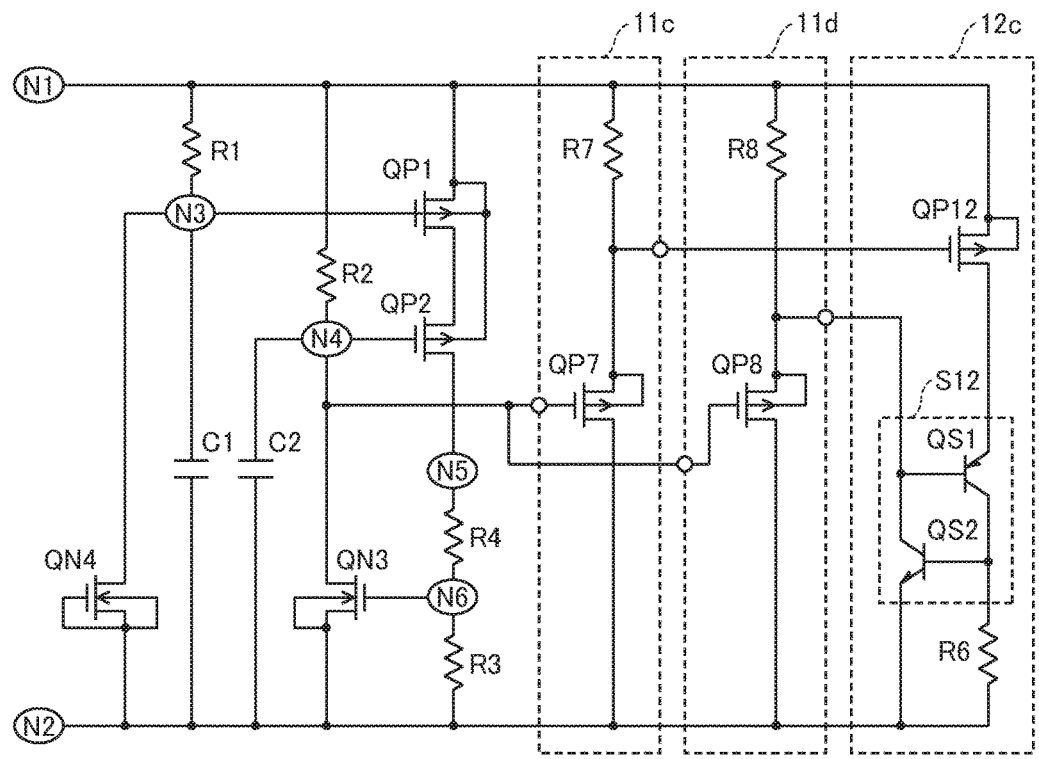
FIG. 12 is a circuit diagram showing an exemplary configuration of a static electricity protection circuit according to a sixth embodiment of the invention.

FIG. 12 is a circuit diagram showing an exemplary configuration of a static electricity protection circuit according to a sixth embodiment of the invention. In the sixth embodiment, detection circuits 11c and 11d are used instead of the detection circuits 11a and 11b in the fifth embodiment shown in FIG. 11, and a discharge circuit 12c is used instead of the discharge circuit 12b. The sixth embodiment may be similar to the fifth embodiment in other respects.

As shown in FIG. 12, the detection circuit 11c includes a P-channel MOS transistor QP7 and a resistance element R7. The source of the transistor QP7 is connected to the node N1 via the resistance element R7, the drain is connected to the node N2, and the gate is connected to the node N4. The detection circuit 11d includes a P-channel MOS transistor QP8 and a resistance element R8. The source of the transistor QP8 is connected to the node N1 via the resistance element R8, the drain is connected to the node N2, and the gate is connected to the node N4. The transistors QP7 and QP8 constitute source followers.

The discharge circuit 12c includes a P-channel MOS transistor QP12 and a thyristor S12 that are connected in series, and the resistance element R6. The source of the transistor QP12 is connected to the node N1, and the gate is connected to the output terminal of the detection circuit 11c. The emitter of the transistor QS1 is connected to the drain of the transistor QP12, the collector is connected to the node N2 via the resistance element R6, and the base is connected to the output terminal of the detection circuit 11d. The collector of the transistor QS2 is connected to the output terminal of the detection circuit 11d, the emitter is connected to the node N2, and the base is connected to the collector of the transistor QS1. Accordingly, when the potential of the node N4 drops, the transistor QP12 and the thyristor S12 enter the on state.

According to the sixth embodiment, the drain of the transistor QN3 is connected to the transistor QP12 or the thyristor S12 via only a one-step source follower, and therefore the relative conductance therebetween is lower. Accordingly, the static electricity protection circuit can realize a more stable operation in a state in which current flows while a constant operation voltage is maintained.

Seventh Embodiment

Figure 13:
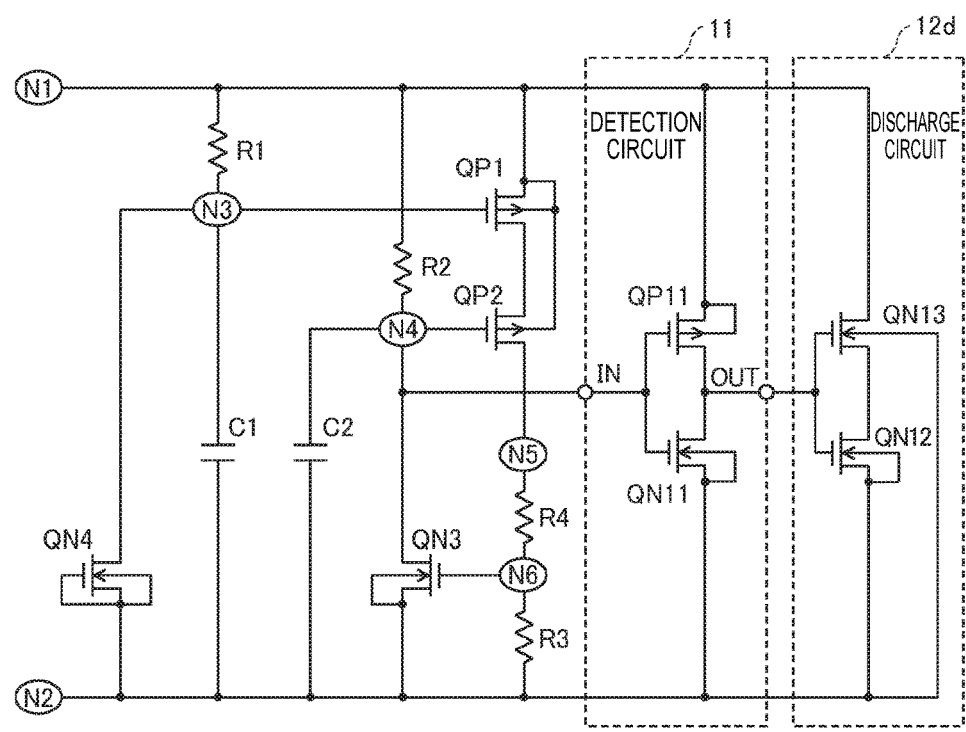
FIG. 13 is a circuit diagram showing an exemplary configuration of a static electricity protection circuit according to a seventh embodiment of the invention.

FIG. 13 is a circuit diagram showing an exemplary configuration of a static electricity protection circuit according to a seventh embodiment of the invention. In the seventh embodiment, an N-channel MOS transistor QN13 has been added to the first embodiment shown in FIG. 3. The seventh embodiment may be similar to the first embodiment in other respects.

As shown in FIG. 13, the discharge circuit 12d includes multiple transistors QN12 and QN13 that are connected in series. The drain of the transistor QN13 is connected to the node N1, and the gate is connected to the output terminal of the detection circuit 11. The drain of the transistor QN12 is connected to the source of the transistor QN13, the source is connected to the node N2, and the gate is connected to the output terminal of the detection circuit 11. Accordingly, when the potential of the node N4 reaches the low level, the transistors QN12 and QN13 enter the on state.

According to the seventh embodiment, by connecting multiple transistors in cascade in the discharge circuit 12d, it is possible to increase the snapback start voltage and the hold voltage. Accordingly, in comparison with the first embodiment, the likelihood that the transistors in the discharge circuit will break down is lower. Note that a gate of one of the transistors QN12 and QN13 may be connected to the node N1. In this case, the load capacity of the detection circuit 11 can be reduced.

Eighth Embodiment

Figure 14:
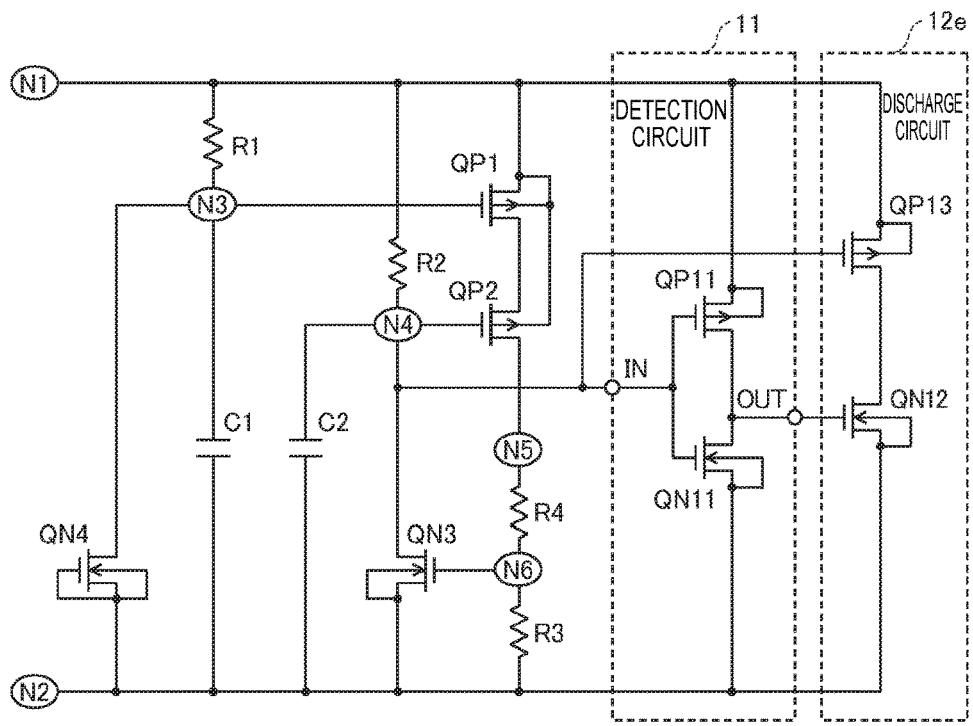
FIG. 14 is a circuit diagram showing an exemplary configuration of a static electricity protection circuit according to an eighth embodiment of the invention.

FIG. 14 is a circuit diagram showing an exemplary configuration of a static electricity protection circuit according to an eighth embodiment of the invention. In the eighth embodiment, a P-channel MOS transistor QP13 is used instead of the N-channel MOS transistor QN13 shown in FIG. 13. The eighth embodiment may be similar to the seventh embodiment in other respects.

As shown in FIG. 14, a discharge circuit 12e includes multiple transistors QN12 and QP13 that are connected in series. The source of the transistor QP13 is connected to the node N1, and the gate is connected to the node N4. The drain of the transistor QN12 is connected to the drain of the transistor QP13, the source is connected to the node N2, and the gate is connected to the output terminal of the detection circuit 11. Accordingly, when the potential of the node N4 reaches the low level, the transistors QN12 and QP13 enter the on state.

According to the eighth embodiment, by connecting a P-channel MOS transistor and an N-channel MOS transistor in a cascade in the discharge circuit 12e, the drains of the transistors are not connected to the node N1 or N2, and therefore it is possible to increase the snapback start voltage and the hold voltage. Accordingly, in comparison with the first embodiment, the likelihood that the transistors in the discharge circuit will break down is lower.

Ninth Embodiment

Figure 15:
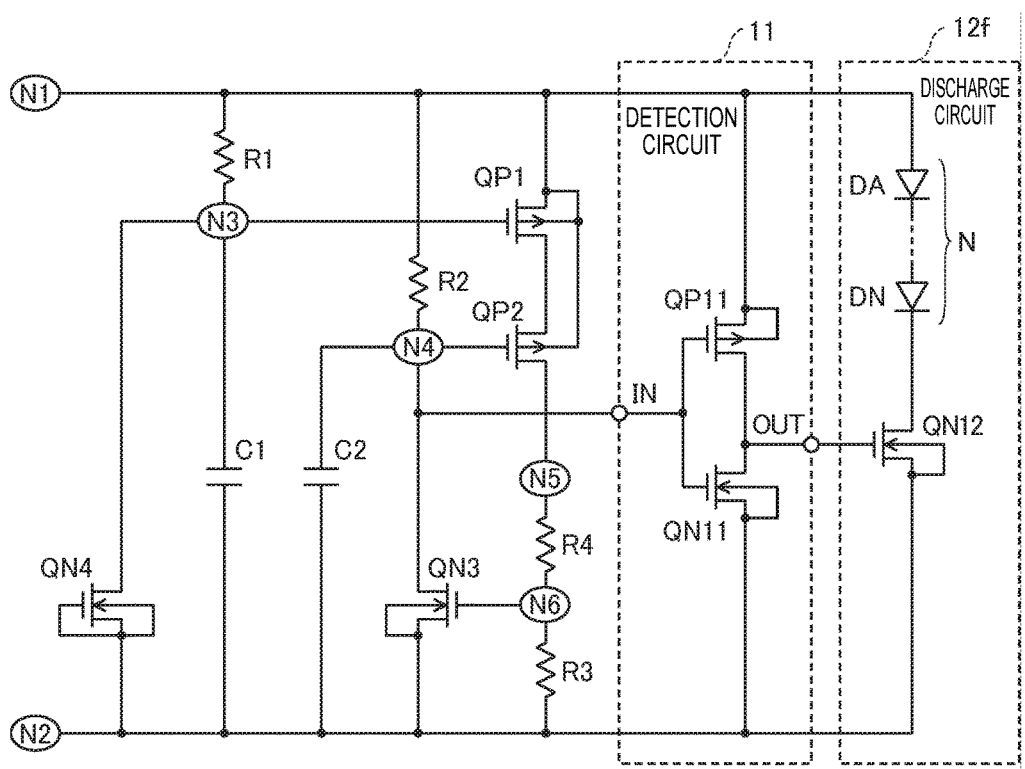
FIG. 15 is a circuit diagram showing an exemplary configuration of a static electricity protection circuit according to a ninth embodiment of the invention.

FIG. 15 is a circuit diagram showing an exemplary configuration of a static electricity protection circuit according to a ninth embodiment of the invention. In the ninth embodiment, N (N being a natural number) diodes DA to DN have been added to the first embodiment shown in FIG. 3. The ninth embodiment may be similar to the first embodiment in other respects.

As shown in FIG. 15, a discharge circuit 12f includes the transistor QN12 and the diodes DA to DN, which are connected in series. The anode of the diode DA is connected to the node N1. The drain of the transistor QN12 is connected to the cathode of the diode DN, the source is connected to the node N2, and the gate is connected to the output terminal of the detection circuit 11. Accordingly, when the potential of the node N4 reaches the low level, the transistor QN12 enters the on state.

According to the ninth embodiment, by connecting the diodes to the transistor in series in the discharge circuit 12f, it is possible to increase the snapback start voltage and the hold voltage. Accordingly, in comparison with the first embodiment, the likelihood that the transistors in the discharge circuit will break down is lower.

Tenth Embodiment

Figure 16:
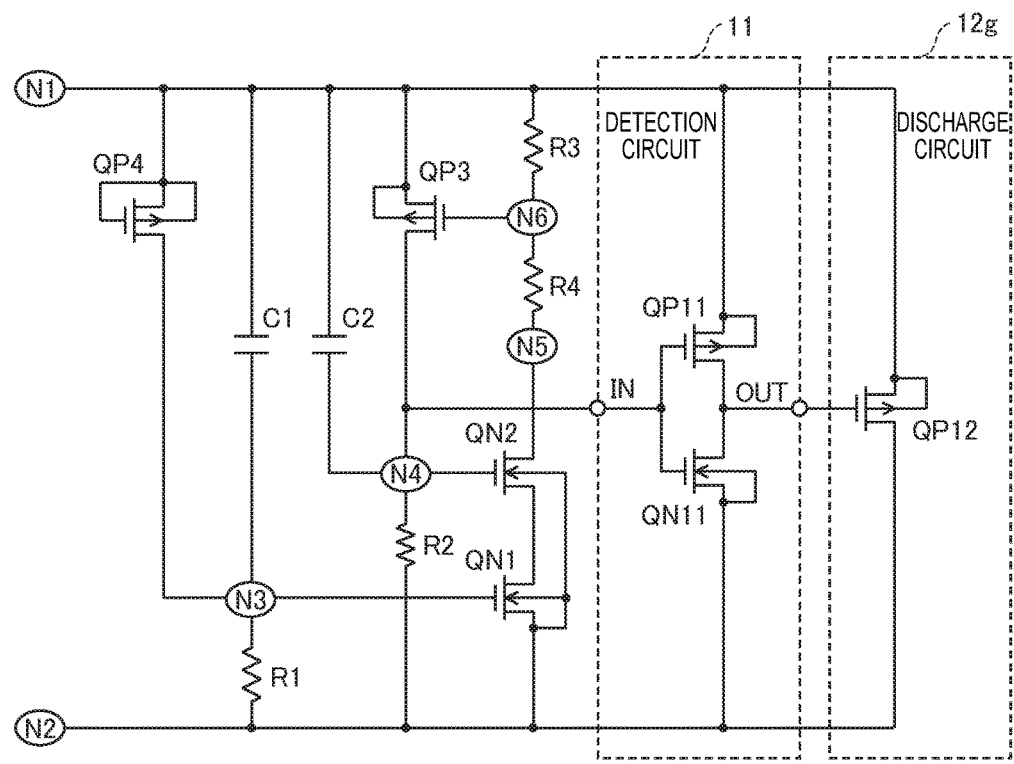
FIG. 16 is a circuit diagram showing an exemplary configuration of a static electricity protection circuit according to a tenth embodiment of the invention.

FIG. 16 is a circuit diagram showing an exemplary configuration of a static electricity protection circuit according to a tenth embodiment of the invention. In the first to ninth embodiments of the invention, replacement of a P-channel MOS transistor with an N-channel MOS transistor or vice versa may be performed for at least one transistor, and the connection of the elements may be changed accordingly. As an example, FIG. 16 shows a static electricity protection circuit in which a P-channel MOS transistor and an N-channel MOS transistor have been switched in the static electricity protection circuit according to the first embodiment shown in FIG. 3.

As shown in FIG. 16, the static electricity protection circuit includes resistance elements R1 to R4 serving as first to fourth impedance elements, capacitors C1 and C2, N-channel MOS transistors QN1 and QN2, P-channel MOS transistors QP3 and QP4, a detection circuit 11, and a discharge circuit 12g.

The resistance element R1 is connected between the node N2 and the node N3 and the transistor QP4 is connected between the node N3 and the node N1. The transistor QP4 has a drain connected to the node N3 and a source and gate connected to the node N1, and functions as a clamp circuit. The capacitor C1 is connected in parallel with the transistor QP4 between the node N3 and the node N1. Also, the resistance element R2 is connected between the node N2 and the node N4 and the capacitor C2 is connected between the node N4 and the node N1.

The transistors QN1 and QN2 are connected in series between the node N2 and the node N5. The transistor QN1 has a source connected to the node N2 and a gate connected to the node N3. The transistor QN2 has a source connected to the drain of the transistor QN1, a drain connected to the node N5, and a gate connected to the node N4. Note that the position of the transistor QN1 and the position of the transistor QN2 may be switched. When the node N1 reaches a higher potential than the node N2, the transistor QN1 enters the on state accompanying an increase in the potential difference generated between the two ends of the resistance element R1, and the transistor QN2 enters the on state accompanying an increase in the potential difference generated between the two ends of the resistance element R2.

The resistance elements R4 and R3 are connected in series between the node N5 and the node N1. The resistance elements R4 and R3 form a voltage division circuit that divides the voltage between the node N5 and the node N1. The transistor QP3 is connected between the node N4 and the node N1. The transistor QP3 has a drain connected to the node N4, a source connected to the node N1, and a gate connected to a node N6, which is the point of connection between the resistance element R4 and the resistance element R3.

When the transistors QN1 and QN2 enter the on state, the current that flows in the resistance elements R4 and R3 increases, and the voltage divided by the voltage division circuit constituted by the resistance elements R4 and R3 is applied to the gate of the transistor QP3. Accordingly, when the node N1 reaches a higher potential than the node N2, the transistor QP3 enters the on state accompanying an increase in the potential difference generated between the two ends of the resistance element R3.

The discharge circuit 12g is connected between the node N1 and the node N2, and if the output voltage of the detection circuit 11 falls in accordance with an increase in the potential difference generated between the two ends of the resistance element R2 when the node N1 reaches a higher potential than the node N2, the discharge circuit 12g allows current to flow from the node N1 to the node N2. For example, the discharge circuit 12g shown in FIG. 16 includes the P-channel MOS transistor QP12. The transistor QP12 has a drain connected to the node N2, a source connected to the node N1, and a gate connected to the output terminal OUT of the detection circuit 11. The transistor QP12 enters the on state and allows the current to flow from the node N1 to the node N2 when the voltage between the gate and source becomes greater than or equal to the threshold voltage.

Here, operations performed by the static electricity protection circuit shown in FIG. 16 will be described in detail.

The resistance element R1 and the capacitor C1 form a first series circuit, and the resistance element R2 and the capacitor C2 form a second series circuit. In the description hereinafter, the time constant of the first series circuit is assumed to be greater than the time constant of the second series circuit. When a positive voltage (potential of node N1>potential of node N2) is applied between the node N1 and the node N2, current flows from the node N1 to the node N2 via the first series circuit. Accordingly, the potential difference generated between the two ends of the resistance element R1 increases, and the capacitor C1 is charged. Also, current flows from the node N1 to the node N2 via the second series circuit. Accordingly, the potential difference generated between the two ends of the resistance element R2 increases, and the capacitor C2 is charged.

At a time of normal operation, if the voltage applied between the node N1 and the node N2 rises slowly, the potential difference generated between the two ends of the resistance element R2 remains smaller than the threshold voltage of the transistor QN2, and the transistor QN2 remains in the off state. On the other hand, if the voltage applied between the node N1 and the node N2 rises sharply due to electrostatic discharge or the like, first, the potential difference generated between the two ends of the resistance element R1 becomes greater than or equal to the threshold voltage of the transistor QN1, and the transistor QN1 enters the on state. Next, the potential difference generated between the two ends of the resistance element R2 becomes greater than or equal to the threshold voltage of the transistor QN2, and the transistor QN2 enters the on state. Note that at this time, the potential of the input terminal IN of the detection circuit 11 is at the low level.

Due to the transistors QN1 and QN2 entering the on state, the voltage is applied to the voltage division circuit constituted by the resistance elements R4 and R3, and the potential difference generated between the two ends of the resistance element R3 rises from 0 V. Here, if the voltage between the node N1 and the node N2 is smaller than a predetermined voltage, the potential difference generated between the two ends of the resistance element R3 will remain smaller than the threshold voltage of the transistor QP3, and the transistor QP3 will remain in the off state. On the other hand, if the voltage between the node N1 and the node N2 is greater than or equal to a predetermined voltage, the potential difference generated between the two ends of the resistance element R3 becomes greater than or equal to the threshold voltage of the transistor QP3, and the transistor QP3 transitions to the on state.

Due to the transistor QP3 entering the on state, the current that flows in the resistance element R2 increases, and the potential difference generated between the two ends of the resistance element R2 increases, and therefore the current that flows in the transistor QN2 increases. Due to the current that flows in the transistor QN2 increasing, the current that flows in the resistance elements R4 and R3 increases and the potential difference generated between the two ends of the resistance element R3 further increases, and therefore the current that flows in the transistor QP3 increases (positive feedback).

Also, when the output voltage of the detection circuit 11 falls accompanying an increase in the potential difference generated between the two ends of the resistance element R2, the transistor QP12 of the discharge circuit 12g starts to allow current to flow from the node N1 to the node N2. When the current continues to flow to the transistor QP12, the charge accumulated in the semiconductor integrated circuit device is discharged, and the voltage between the node N1 and the node N2 falls below a predetermined voltage.

Accordingly, the potential difference generated between the two ends of the resistance element R3 falls below the threshold voltage of the transistor QP3, and therefore the transistor QP3 transitions from the on state to the off state. As a result, the current that flows in the resistance element R2 decreases, and therefore the output voltage of the detection circuit 11 rises, and the transistor QP12 of the discharge circuit 12a transitions from the on state to the off state. In this way, when the discharge operation is started, the voltage between the node N1 and the node N2 is held at a predetermined voltage (hold voltage) determined by the division ratio of the voltage division circuit. Accordingly, even if the discharge operation is started at a time of normal operation, malfunctioning of the internal circuit can be prevented.

Thereafter, upon the elapse of the amount of time corresponding to the time constant of the first series circuit constituted by the resistance element R1 and the capacitor C1, the transistor QN1 is mandatorily set to the off state, and the discharge operation performed by the transistor QP12 of the discharge circuit 12g stops (mandatory off function). Accordingly, even if the discharge operation is started at the time of turning on the power source, it is possible to stop the discharge operation after the elapse of the predetermined amount of time from when the power source is turned on.

In the present embodiment, the transistor QP4 included in the clamp circuit is connected between the node N3 and the node N1. The transistor QP3 also operates as a clamp circuit. When a voltage greater than or equal to the breakdown voltage (clamp voltage) of the transistors QP4 and QP3 is applied between the node N1 and the node N2, the transistor QP4 breaks down and current flows in the resistance element R1, and therefore the transistor QN1 enters the on state in accordance with an increase in the potential difference generated between the two ends of the resistance element R1. Also, because current flows in the resistance element R2 due to the transistor QP3 breaking down, the transistor QN2 enters the on state in accordance with an increase in the potential difference generated between the two ends of the resistance element R2.

Due to the transistors QN1 and QN2 entering the on state, the voltage is applied to the voltage division circuit constituted by the resistance elements R4 and R3, and the potential difference generated between the two ends of the resistance element R3 rises from 0 V. When the potential difference generated between the two ends of the resistance element R3 becomes greater than or equal to the threshold voltage of the transistor QP3, the transistor QP3 transitions to the on state.

Due to the transistor QP3 entering the on state, the current that flows in the resistance element R2 increases, and the potential difference generated between the two ends of the resistance element R2 increases, and therefore the current that flows in the transistor QN2 increases. Due to the current that flows in the transistor QN2 increasing, the current that flows in the resistance elements R4 and R3 increases and the potential difference generated between the two ends of the resistance element R3 further increases, and therefore the current that flows in the transistor QP3 increases (positive feedback).

Also, when the output voltage of the detection circuit 11 falls in accordance with an increase in the potential difference generated between the two ends of the resistance element R2, the transistor QP12 of the discharge circuit 12g starts to allow current to flow from the node N1 to the node N2. When the current continues to flow to the transistor QP12, the charge accumulated in the semiconductor integrated circuit device is discharged, and the voltage between the node N1 and the node N2 falls below a predetermined voltage.

Accordingly, the potential difference generated between the two ends of the resistance element R3 drops below the threshold voltage of the transistor QP3, and therefore the transistor QP3 transitions from the on state to the off state. As a result, the current that flows in the resistance element R2 decreases, and therefore the output voltage of the detection circuit 11 rises, and the transistor QP12 of the discharge circuit 12g transitions from the on state to the off state. In this way, when the discharge operation is started, the voltage between the node N1 and the node N2 is held at a predetermined voltage (hold voltage) determined by the division ratio of the voltage division circuit. Accordingly, even if the discharge operation is started at a time of normal operation, malfunction of the internal circuit can be prevented.

Thereafter, when the voltage applied between the node N1 and the node N2 becomes smaller than the breakdown voltage (clamp voltage) of the transistor QP4 or QP3, the transistor QN1 or QN2 enters the off state, and therefore the potential difference generated between the two ends of the resistance element R3 drops. Accordingly, the transistor QP3 enters the off state, the output voltage of the detection circuit 11 rises, and the discharge operation of the discharge circuit 12g stops.

According to the present embodiment, even when noise, a discharged charge, or the like is applied from the exterior during a normal operation in which the power source voltage is supplied, if the voltage between the node N1 and the node N2 becomes greater than or equal to the clamp voltage of the clamp circuit, the discharge operation can be started and the discharge circuit 12g and the internal circuit can be protected. Accordingly, it is possible to prevent breakdown or malfunctioning of the semiconductor integrated circuit device caused by electrostatic discharge, or the like.

Eleventh Embodiment

Figure 17:
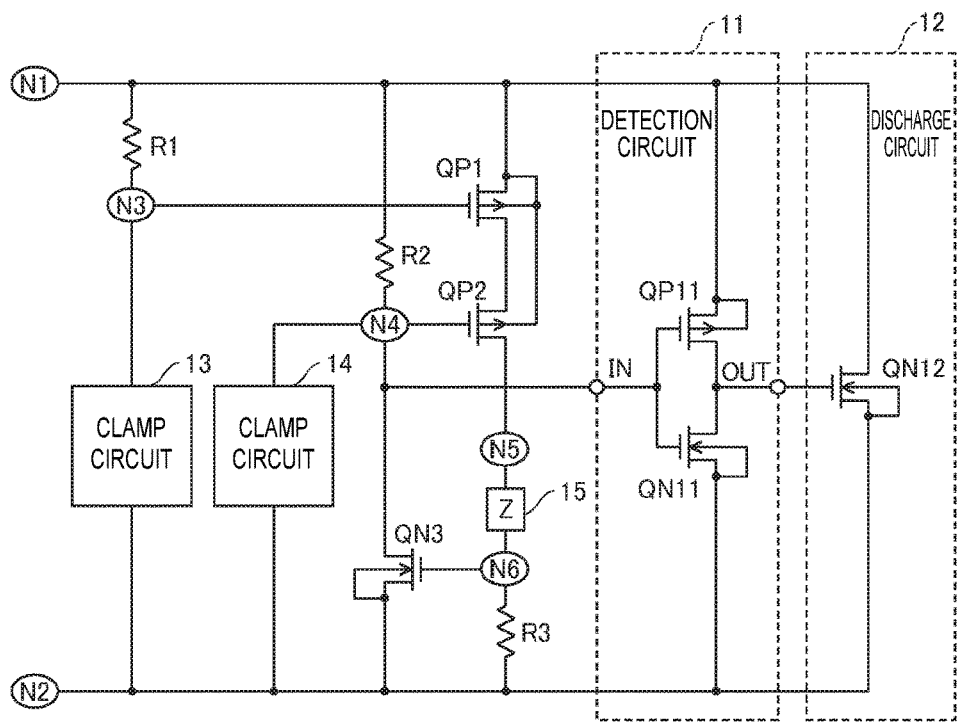
FIG. 17 is a circuit diagram showing an exemplary configuration of a static electricity protection circuit according to an eleventh embodiment of the invention.

FIG. 17 is a circuit diagram showing an exemplary configuration of a static electricity protection circuit according to an eleventh embodiment of the invention. In the first to tenth embodiments of the invention, it is also possible to use a clamp circuit other than a transistor, and it is possible to use an impedance element other than a resistance element instead of at least one of the resistance elements R1 to R6. Also, the capacitor C1 or C2 may be omitted. As an example, FIG. 17 shows a static electricity protection circuit obtained by replacing the transistor QN4 and capacitor C1 with a clamp circuit 13, replacing the capacitor C2 with a clamp circuit 14, and replacing the resistance element R4 with an impedance element 15 in the first embodiment shown in FIG. 3. The eleventh embodiment may be similar to the first embodiment in other respects.

As shown in FIG. 17, the static electricity protection circuit includes the clamp circuit 13, which is connected between the node N3 and the node N2, the clamp circuit 14, which is connected between the node N4 and the node N2, and the impedance element 15, which is connected between the node N5 and the node N6. The impedance element 15 and the resistance element R3 constitute a voltage division circuit that divides the voltage between the node N5 and the node N2.

When a positive high voltage (potential of node N1>potential of node N2) is applied between the node N1 and the node N2, current flows in the clamp circuit 13 via the resistance element R1, and the clamp circuit 13 keeps the voltage between the two ends thereof at an approximately constant voltage (clamp voltage). Also, current flows in the clamp circuit 14 via the resistance element R2, and the clamp circuit 14 keeps the voltage between the two ends at an approximately constant voltage (clamp voltage). Hereinafter, the clamp voltage of the clamp circuit 14 is assumed to be greater than the clamp voltage of the clamp circuit 13.

During a normal operation, if the positive voltage applied between the node N1 and the node N2 is smaller than the clamp voltage of the clamp circuit 14, hardly any current flows in the clamp circuit 14, and therefore the potential difference generated between the two ends of the resistance element R2 remains smaller than the threshold voltage of the transistor QP2, and the transistor QP2 maintains the off state.

On the other hand, if a voltage greater than or equal to the clamp voltage of the clamp circuit 14 is applied between the node N1 and the node N2 due to electrostatic discharge or the like, or during a normal operation, first, current flows from the node N1 to the node N2 via the resistance element R1 and the clamp circuit 13, and therefore the transistor QP1 enters the on state in accordance with an increase in the potential difference generated between the two ends of the resistance element R1. Next, current flows from the node N1 to the node N2 via the resistance element R2 and the clamp circuit 14, and therefore the transistor QP2 enters the on state in accordance with an increase in the potential difference generated between the two ends of the resistance element R2. Note that at this time, the potential of the input terminal IN of the detection circuit 11 is at the high level.

Due to the transistors QP1 and QP2 entering the on state, a voltage is applied to the voltage division circuit constituted by the impedance element 15 and the resistance element R3, and the potential difference generated between the two ends of the resistance element R3 rises from 0 V. Here, if the voltage between the node N1 and the node N2 is smaller than a predetermined voltage, the potential difference generated between the two ends of the resistance element R3 will remain smaller than the threshold voltage of the transistor QN3, and the transistor QN3 will remain in the off state. On the other hand, if the voltage between the node N1 and the node N2 is greater than or equal to a predetermined voltage, the potential difference generated between the two ends of the resistance element R3 becomes greater than or equal to the threshold voltage of the transistor QN3, and the transistor QN3 transitions to the on state.

Due to the transistor QN3 entering the on state, the current that flows in the resistance element R2 increases, and the potential difference generated between the two ends of the resistance element R2 increases, and therefore the current that flows in the transistor QP2 increases. Due to the current that flows in the transistor QP2 increasing, the current that flows in the impedance element 15 and the resistance element R3 increases and the potential difference generated between the two ends of the resistance element R3 further increases, and therefore the current that flows in the transistor QN3 increases (positive feedback).

Also, when the output voltage of the detection circuit 11 rises accompanying an increase in the potential difference generated between the two ends of the resistance element R2, the transistor QN12 of the discharge circuit 12 starts to allow current to flow from the node N1 to the node N2. When the current continues to flow to the transistor QN12, the charge accumulated in the semiconductor integrated circuit device is discharged, and the voltage between the node N1 and the node N2 falls below a predetermined voltage.

Accordingly, the potential difference generated between the two ends of the resistance element R3 falls below the threshold voltage of the transistor QN3, and therefore the transistor QN3 transitions from the on state to the off state. As a result, the current that flows in the resistance element R2 decreases, and therefore the output voltage of the detection circuit 11 drops, and the transistor QN12 of the discharge circuit 12 transitions from the on state to the off state. In this way, when the discharge operation is started, the voltage between the node N1 and the node N2 is held at a predetermined voltage (hold voltage) determined by the division rate of the voltage division circuit. Accordingly, even if the discharge operation is started at a time of normal operation, malfunction of the internal circuit can be prevented.

Thereafter, when the voltage applied between the node N1 and the node N2 becomes smaller than the clamp voltage of the clamp circuit 13, the transistor QP1 enters the off state, and therefore the potential difference generated between the two ends of the resistance element R3 drops. Accordingly, the transistor QN3 enters the off state, the output voltage of the detection circuit 11 falls, and the discharge operation of the discharge circuit 12 stops. Thus, according to the present embodiment, the voltage applied when starting the discharge operation can be set to be relatively high, while the voltage applied when stopping the discharge operation can be set to be relatively low.

Twelfth Embodiment

Figure 18:
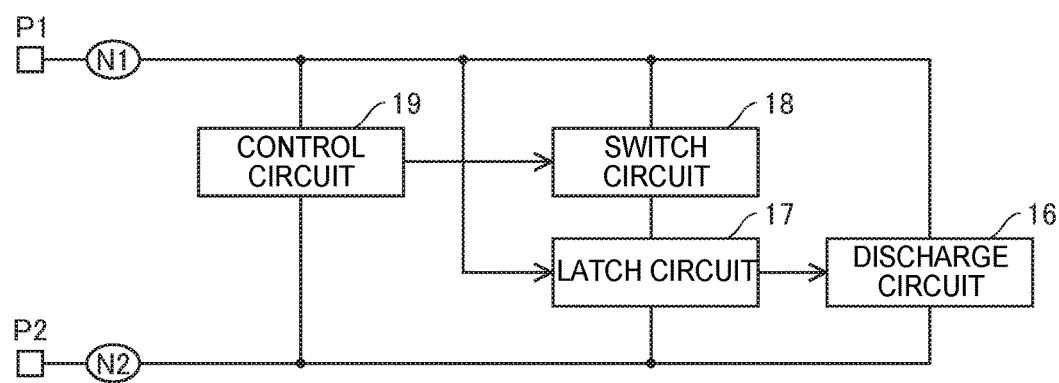
FIG. 18 is a circuit diagram showing an exemplary configuration of a static electricity protection circuit according to a twelfth embodiment of the invention.

FIG. 18 is a block diagram showing an exemplary configuration of a static electricity protection circuit according to a twelfth embodiment of the invention. As shown in FIG. 18, the static electricity protection circuit is connected to a first terminal P1 via the node N1, and is connected to a second terminal P2 via the node N2. This static electricity protection circuit includes a discharge circuit 16, a latch circuit 17, a switch circuit 18, and a control circuit 19.

The discharge circuit 16 is connected between the node N1 and the node N2 and allows current to flow from the node N1 to the node N2 by performing a discharge operation in accordance with a signal output from the latch circuit 17. When static electricity is applied to the first terminal P1 or the second terminal P2, the latch circuit 17 latches a signal for causing the discharge circuit 16 to operate and outputs the signal to the discharge circuit 16.

For example, the switch circuit 18 is connected between the node N1 and the latch circuit 17 and controls the latch circuit 17 using an operation of switching on and off. If the voltage applied between the node N1 and the node N2 is greater than or equal to a predetermined voltage, the control circuit 19 turns on the switch circuit 18 and causes the latch circuit 17 to operate.

For example, the discharge circuit 16 may be constituted by the discharge circuit 12 shown in FIG. 3 or the like. The latch circuit 17 may be constituted by the resistance elements R2 to R4, the capacitor C2, and the transistors QP2 and QN3 shown in FIG. 3, or the like. The switch circuit 18 may be constituted by the transistor QP1 shown in FIG. 3 or the like. The control circuit 19 may be constituted by the resistance R1 and the transistors QN3 and QN4 shown in FIG. 3, or the like.

The static electricity protection circuit according to the present embodiment is provided with the latch circuit 17, which causes a discharge operation to start when static electricity is applied to the first terminal P1 or the second terminal P2, and the control circuit 19, which turns on the switch circuit 18 when the voltage applied between the node N1 and the node N2 is greater than or equal to a predetermined voltage. Accordingly, the discharge operation is started only if the voltage applied between the node N1 and the node N2 is greater than or equal to the predetermined voltage. Also, even when noise, a discharged charge, or the like is applied from the exterior during a normal operation in which the power source voltage is supplied, if the voltage between the node N1 and the node N2 is greater than or equal to the predetermined voltage, the discharge operation can be started and the discharge circuit 16 and the internal circuit can be protected.

Example of Impedance Element

FIGS. 19A to 19H are diagrams showing exemplary impedance elements that can be used instead of resistance elements in the embodiments of the invention. In the embodiments of the invention, an impedance element shown in FIGS. 19A to 19H can be used instead of at least one of the resistance elements R1 to R6 shown in FIGS. 3 to 16. Note that in FIG. 19, "N+" indicates a high-potential-side node, and "N−" indicates a low-potential-side node.

Figure 19A:
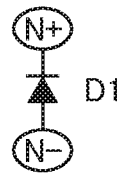
FIGS. 19A to 19H are diagrams showing exemplary impedance elements that can be used in the embodiments of the invention.

FIG. 19A shows a diode D1 having a cathode connected to a high-potential-side node N+ and an anode connected to a low-potential-side node N−. When current flows from the node N+ to the node N− via the diode D1, the voltage between the node N+ and the node N− becomes equal to the breakdown voltage of the diode D1.

Figure 19B:
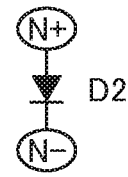

FIG. 19B shows a diode D2 having an anode connected to a high-potential-side node N+ and a cathode connected to a low-potential-side node N−. When current flows from the node N+ to the node N− via the diode D2, the voltage between the node N+ and the node N− becomes equal to the forward voltage of the diode D2.

Figure 19C:
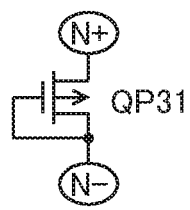

FIG. 19C shows a P-channel MOS transistor QP31 that has a source connected to the high-potential-side node N+, and a drain and gate connected to the low-potential-side node N−. When current flows from the node N+ to the node N− via the transistor QP31, the voltage between the node N+ and the node N− becomes equal to the threshold voltage of the transistor QP31.

Figure 19D:
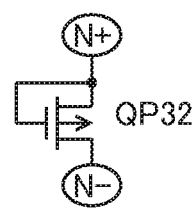

FIG. 19D shows a P-channel MOS transistor QP32 that has a source and gate connected to the high-potential-side node N+, and a drain connected to the low-potential-side node N−. When current flows from the node N+ to the node N− via the transistor QP32, the voltage between the node N+ and the node N− becomes equal to the breakdown voltage of the transistor QP32.

Figure 19E:
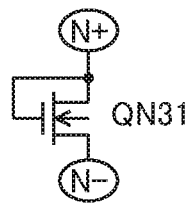

FIG. 19E shows an N-channel MOS transistor QN31 that has a drain and gate connected to the high-potential-side node N+ and a source connected to the low-potential-side node N−. When current flows from the node N+ to the node N− via the transistor QN31, the voltage between the node N+ and the node N− becomes equal to the threshold voltage of the transistor QN31.

Figure 19F:
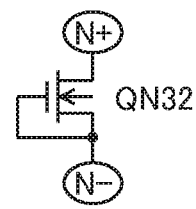

FIG. 19F shows an N-channel MOS transistor QN32 that has a drain connected to the high-potential-side node N+ and a source and gate connected to the low-potential-side node N−. When current flows from the node N+ to the node N− via the transistor QN32, the voltage between the node N+ and the node N− becomes equal to the breakdown voltage of the transistor QN32.

Figure 19G:
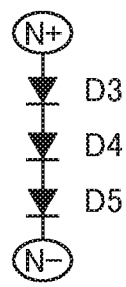

FIG. 19G shows an example in which the impedance element includes multiple identical devices. This impedance element is obtained by connecting three diodes D3 to D5 in series, the anode of the diode D3 being connected to the high-potential-side node N+, and the cathode of the diode D5 being connected to the low-potential-side node N−. When current flows from the node N+ to the node N− via the diodes D3 to D5, the voltage between the node N+ and the node N− becomes equal to the sum of the forward voltages of the diodes D3 to D5.

Figure 19H:
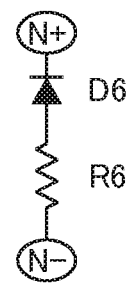

FIG. 19H shows an example in which the impedance element includes multiple different devices. This impedance element is obtained by connecting a diode D6 and a resistance element R7 in series, the cathode of the diode D6 being connected to the high-potential-side node N+, and one end of the resistance element R7 being connected to the low-potential-side node N−. When current flows from the node N+ to the node N− via the diode D6 and the resistance element R7, the voltage between the node N+ and the node N− becomes equal to the sum of the breakdown voltage of the diode D6 and the resistance of the resistance element R7×current.

Thus, by selecting an appropriate device from among a resistance element, a diode, and a transistor, or by combining multiple devices, it is possible to freely set the characteristics of the static electricity protection circuit and to provide a static electricity protection circuit that is not likely to be influenced by variations in processing.

Example of Clamp Circuit

The elements shown in FIGS. 19A to 19G can also be used as clamp circuits in the embodiments of the invention. Also, as shown in FIG. 20, a device obtained by connecting an element shown in one of FIGS. 19A to 19G and a capacitor in parallel may be used as the clamp circuit.

Example of Discharge Circuit

Other than a MOS transistor (Metal Oxide Semiconductor FET), it is possible to use a three-terminal element, circuit, or the like having a function of controlling switching on/off of current in accordance with a control signal in the discharge circuit of the static electricity protection circuit according to the embodiments of the invention.

Examples of three-terminal elements include a junction FET, a metal semiconductor FET, a bipolar transistor, and a thyristor. These three-terminal elements can be used as substitutes for other MOS transistors outside of a discharge circuit as well.

FIGS. 21A and 21B are diagrams showing exemplary three-terminal elements that can be used instead of MOS transistors in the embodiments of the invention. Note that in FIGS. 21A and 21B, "N+" indicates a high-potential-side node, "N−" indicates a low-potential-side node, and "NS" indicates a node to which a control signal is supplied.

The NPN bipolar transistor QB1 shown in FIG. 21A can be used instead of the N-channel MOS transistor QN12 in the discharge circuit 12 shown in FIG. 3 and the like. The transistor QB1 has a collector connected to the node N+, an emitter connected to the node N−, and a base connected to the node NS.

Also, the PNP bipolar transistor QB2 shown in FIG. 21B can be used instead of the P-channel MOS transistor QP12 of the discharge circuit 12g shown in FIG. 16 and the like. The transistor QB2 has an emitter connected to the node N+, a collector connected to the node N−, and a base connected to the node NS.

Electronic Apparatus

Next, an electronic apparatus according to an embodiment of the invention will be described.

Figure 22:
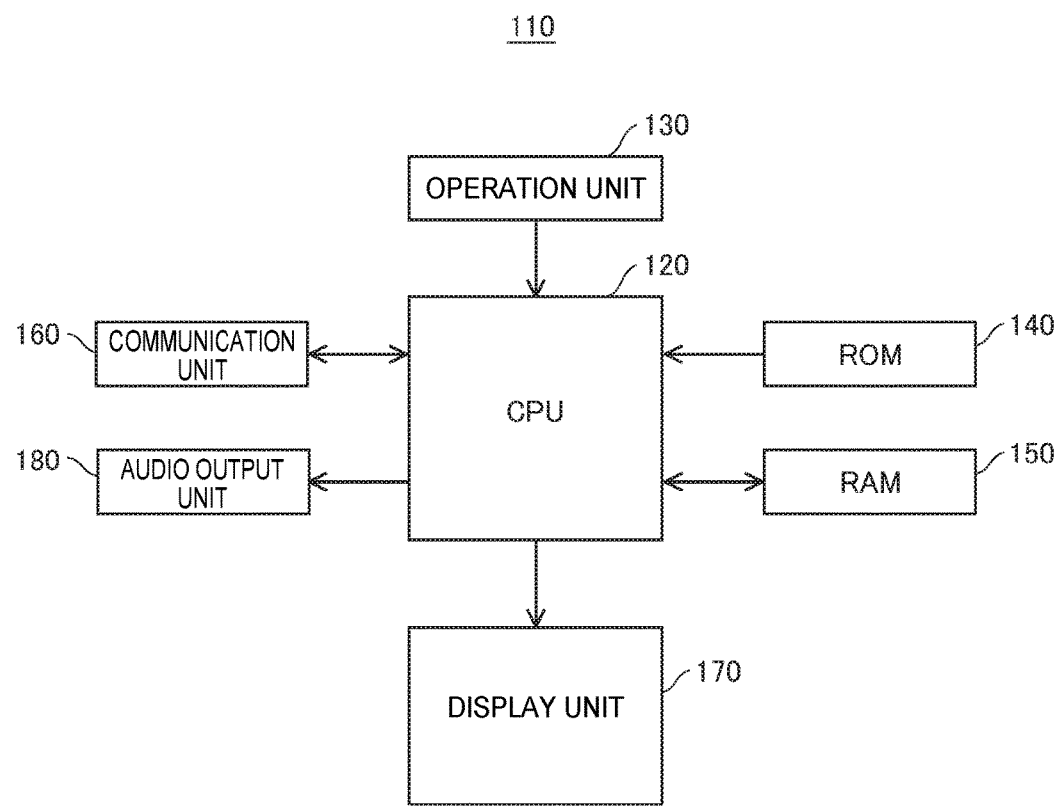
FIG. 22 is a block diagram showing an exemplary configuration of an electronic apparatus according to an embodiment of the invention.

FIG. 22 is a block diagram showing an exemplary configuration of an electronic apparatus according to an embodiment of the invention. As shown in FIG. 22, an electronic apparatus 110 may include a CPU 120, an operation unit 130, a ROM (Read-Only Memory) 140, a RAM (Random Access Memory) 150, a communication unit 160, a display unit 170, and an audio output unit 180.

Here, the CPU 120 and at least a portion of the ROM 140 to the audio output unit 180 are built into the semiconductor integrated circuit device according to an embodiment of the invention. Note that a portion of the constituent elements shown in FIG. 22 may be omitted or modified, and other constituent elements may be added to the constituent elements shown in FIG. 22.

In accordance with a program stored in the ROM 140 or the like, the CPU 120 performs various types of signal processing and control processing using data and the like supplied from the exterior. For example, the CPU 120 performs various types of signal processing in response to operation signals supplied from the operation unit 130, controls the communication unit 160 in order to perform data communication with an external device, generates an image signal for causing various types of images to be displayed on the display unit 170, and generates an audio signal for causing the audio output unit 180 to output various types of audio.

For example, the operation unit 130 is an input device including operation keys, buttons, and switches, and the like, and outputs an operation signal corresponding to an operation performed by the user to the CPU 120. The ROM 140 stores programs, data, and the like according to which the CPU 120 performs various types of signal processing and control processing. Also, the RAM 150 is used as a work region for the CPU 120, and temporarily stores programs and data read out from the ROM 140, data input using the operation unit 130, results of operations executed by the CPU 120 in accordance with a program, and the like. For example, the communication unit 160 is constituted by an analog circuit and a digital circuit, and performs data communication between the CPU 120 and an external device.

For example, the display unit 170 includes an LCD (liquid crystal display device) and displays various types of images based on image signals supplied from the CPU 120. Also, for example, the audio output unit 180 includes a speaker or the like and outputs audio based on an audio signal supplied from the CPU 120.

Examples of the electronic apparatus 110 include a portable terminal such as a mobile telephone, a smart card, a calculator, an electronic dictionary, an electronic game apparatus, a digital still camera, a digital movie camera, a video projector, a television, a video phone, a security television monitor, a head-mounted display, a personal computer, a printer, a network apparatus, a car navigation apparatus, a measuring apparatus, and a medical apparatus (e.g., an electronic thermometer, a blood pressure meter, a blood sugar meter, an electrocardiographic apparatus, an ultrasonic diagnostic apparatus, and an electronic endoscope).

According to the present embodiment, it is possible to provide a highly-reliable electronic apparatus that is not likely to break down by using a semiconductor integrated circuit device that can protect a discharge circuit and an internal circuit by starting a discharge operation also when noise, a discharged charge, or the like is applied from the exterior during a normal operation in which the power source voltage is supplied.

The invention is not limited to the above-described embodiments, and many variations are possible within the technical idea of the invention by a person having ordinary knowledge in the technical field.

The entire disclosure of Japanese Patent Application No. 2015-171729, filed Sep. 1, 2015 is expressly incorporated by reference herein.

What is claimed is:

1. A static electricity protection circuit that is connected to a first terminal via a first node and is connected to a second terminal via a second node, comprising:
    a first impedance element connected between one of the first and second nodes and a third node;
    a first clamp circuit connected between the third node and the other of the first and second nodes;
    a first transistor configured to turn on in accordance with an increase in a potential difference generated between two ends of the first impedance element when the first node reaches a higher potential than the second node;
    a second impedance element connected between the one of the first and second nodes and a fourth node;
    a capacitor or second clamp circuit connected between the fourth node and the other of the first and second nodes;
    a second transistor that is connected in series with the first transistor between the one of the first and second nodes and a fifth node, and is configured to turn on in accordance with an increase in a potential difference generated between two ends of the second impedance element when the first node reaches a higher potential than the second node;
    a third impedance element connected between the fifth node and the other of the first and second nodes;
    a third transistor that is connected between the fourth node and the other of the first and second nodes, and is configured to turn on in accordance with an increase in a potential difference generated between two ends of the third impedance element when the first node reaches a higher potential than the second node; and
    a discharge circuit that is connected between the first node and the second node and is configured to allow current to flow from the first node to the second node in accordance with an increase in a potential difference generated between the two ends of the second or third impedance element when the first node reaches a higher potential than the second node.

2. A static electricity protection circuit that is connected to a first terminal via a first node and is connected to a second terminal via a second node, comprising:
    a first clamp circuit connected between one of the first and second nodes and a third node;
    a first impedance element connected between the third node and the other of the first and second nodes;
    a first transistor configured to turn on in accordance with an increase in a potential difference generated between two ends of the first impedance element when the first node reaches a higher potential than the second node;
    a second impedance element connected between the one of the first and second nodes and a fourth node;
    a capacitor or second clamp circuit connected between the fourth node and the other of the first and second nodes;
    a second transistor that is connected between the one of the first and second nodes and a fifth node, and is configured to turn on in accordance with an increase in a potential difference generated between two ends of the second impedance element when the first node reaches a higher potential than the second node;
    a third impedance element connected between the fifth node and the other of the first and second nodes;
    a third transistor that is connected in series with the first transistor between the fourth node and the other of the first and second nodes, and is configured to turn on in accordance with an increase in a potential difference generated between two ends of the third impedance element when the first node reaches a higher potential than the second node; and
    a discharge circuit that is connected between the first node and the second node and is configured to allow current to flow from the first node to the second node in accordance with an increase in a potential difference generated between the two ends of the second or third impedance element when the first node reaches a higher potential than the second node.

3. The static electricity protection circuit according to claim 1, further comprising
    a fourth impedance element connected between the fifth node and the sixth node,
    wherein the third impedance element is connected between the sixth node and the other of the first and second nodes.

4. The static electricity protection circuit according to claim 2, further comprising a second capacitor connected in parallel with the first clamp circuit.

5. The static electricity protection circuit according to claim 1, wherein a breakdown voltage of the discharge circuit is higher than a clamp voltage of the first clamp circuit and higher than a clamp voltage of the second clamp circuit.

6. The static electricity protection circuit according to claim 1, wherein the first and second clamp circuits include a transistor having an impurity diffusion region of a first conductivity type, and the discharge circuit includes a transistor having an impurity diffusion region of a second conductivity type.

7. The static electricity protection circuit according to claim 1, wherein the discharge circuit includes a transistor and a thyristor connected in series.

8. The static electricity protection circuit according to claim 1, wherein the discharge circuit includes a plurality of transistors connected in series.

9. The static electricity protection circuit according to claim 1, wherein the discharge circuit includes a transistor and a diode connected in series.

10. The static electricity protection circuit according to claim 2, further comprising
    a fourth impedance element connected between the fifth node and the sixth node,
    wherein the third impedance element is connected between the sixth node and the other of the first and second nodes.

11. The static electricity protection circuit according to claim 10, further comprising a second capacitor connected in parallel with the first clamp circuit.

12. The static electricity protection circuit according to claim 2, wherein a breakdown voltage of the discharge circuit is higher than a clamp voltage of the first clamp circuit and higher than a clamp voltage of the second clamp circuit.

13. The static electricity protection circuit according to claim 2, wherein the first and second clamp circuits include a transistor having an impurity diffusion region of a first conductivity type, and the discharge circuit includes a transistor having an impurity diffusion region of a second conductivity type.

14. The static electricity protection circuit according to claim 2, wherein the discharge circuit includes a transistor and a thyristor connected in series.

15. The static electricity protection circuit according to claim 2, wherein the discharge circuit includes a plurality of transistors connected in series.

16. The static electricity protection circuit according to claim 2, wherein the discharge circuit includes a transistor and a diode connected in series.

17. A static electricity protection circuit that is connected to a first terminal via a first node and is connected to a second terminal via a second node, comprising:
a discharge circuit connected between the first node and the second node;
a latch circuit configured to latch and output a signal for causing the discharge circuit to operate when static electricity is applied to the first or second terminal;
a switch circuit configured to control the latch circuit; and
a control circuit configured to cause the latch circuit to operate by turning on the switch circuit in a case where a voltage applied between the first node and the second node is greater than or equal to a predetermined voltage, the control circuit including:
a first impedance element connected between one of the first and second nodes and a third node,
a first transistor configured to turn on in accordance with an increase in a potential difference generated between two ends of the first impedance element when the first node reaches a higher potential than the second node, and
a second transistor connected in series with the first transistor between the one of the first and second nodes and a fifth node, and is configured to turn on in response to the voltage applied between the first node and the second node being greater than or equal to the predetermined voltage.

18. A semiconductor integrated circuit device comprising the static electricity protection circuit according to claim 1.

19. A semiconductor integrated circuit device comprising the static electricity protection circuit according to claim 9.

20. An electronic apparatus comprising the semiconductor integrated circuit device according to claim 18.

* * * * *